(12) United States Patent
Hara et al.

(10) Patent No.: US 9,058,912 B2
(45) Date of Patent: Jun. 16, 2015

(54) PASTE COMPOSITION AND DIELECTRIC COMPOSITION USING THE SAME

(75) Inventors: Yoshitake Hara, Otsu (JP); Yuka Yamashiki, Otsu (JP); Manabu Kawasaki, Otsu (JP); Toshihisa Nonaka, Otsu (JP)

(73) Assignee: Toray Industries, Inc., Tokyo (JP)

( * ) Notice: Subject to any disclaimer, the term of this patent is extended or adjusted under 35 U.S.C. 154(b) by 843 days.

(21) Appl. No.: 12/805,179

(22) Filed: Jul. 15, 2010

(65) Prior Publication Data

US 2011/0014448 A1    Jan. 20, 2011

Related U.S. Application Data

(63) Continuation-in-part of application No. 10/551,031, filed as application No. PCT/JP2004/004182 on Mar. 25, 2004, now abandoned.

(30) Foreign Application Priority Data

Apr. 4, 2003   (JP) ................................. 2003-101226
Jun. 30, 2003  (JP) ................................. 2003-186632

(51) Int. Cl.
| | |
|---|---|
| C08K 3/00 | (2006.01) |
| C08K 3/10 | (2006.01) |
| C08K 3/22 | (2006.01) |
| H01B 3/00 | (2006.01) |
| H01B 3/40 | (2006.01) |
| H01G 4/10 | (2006.01) |
| H01G 4/12 | (2006.01) |
| H01G 4/20 | (2006.01) |
| H05K 1/16 | (2006.01) |
| H01B 3/36 | (2006.01) |

(52) U.S. Cl.
CPC ................. *H01B 3/006* (2013.01); *H01B 3/40* (2013.01); *H01G 4/10* (2013.01); *H01G 4/12* (2013.01); *H01G 4/20* (2013.01); *H05K 1/162* (2013.01); *H05K 2201/0154* (2013.01); *H05K 2201/0209* (2013.01); *H01B 3/36* (2013.01)

(58) Field of Classification Search
CPC ..................................................... C08L 63/00
USPC ................... 428/413; 524/401, 413
See application file for complete search history.

(56) References Cited

U.S. PATENT DOCUMENTS

| | | | |
|---|---|---|---|
| 5,102,720 A | 4/1992 | Raj | 428/209 |
| 5,270,416 A | 12/1993 | Toman et al. | 526/273 |
| 6,827,968 B2 | 12/2004 | Naoe | 427/122 |
| 2001/0055699 A1 | 12/2001 | Kato et al. | 428/694 BR |
| 2002/0086161 A1 | 7/2002 | Smetana et al. | 428/413 |
| 2003/0026584 A1 | 2/2003 | Ingman et al. | 385/144 |
| 2003/0047802 A1 | 3/2003 | Hiramatsu et al. | 257/703 |
| 2003/0049517 A1 | 3/2003 | Hampden-Smith et al. | 429/44 |
| 2003/0054147 A1 | 3/2003 | Niwa | 428/209 |
| 2003/0138731 A1 | 7/2003 | Fang | 430/280.1 |

FOREIGN PATENT DOCUMENTS

| | | |
|---|---|---|
| CN | 1433563 A | 7/2003 |
| JP | 53-88198 | 8/1978 |
| JP | 5-57852 A | 3/1993 |
| JP | 6-85413 A | 3/1994 |
| JP | 8-293429 A | 11/1996 |
| JP | 10-158472 A | 6/1998 |
| JP | 2000-199956 A | 7/2000 |
| JP | 2001-233669 A | 8/2001 |
| JP | 2001-243837 A | 9/2001 |
| JP | 2001-294445 A | 10/2001 |
| JP | 2002-226675 A | 8/2002 |
| JP | 2002-265797 A | 9/2002 |
| JP | 2002-293619 A | 10/2002 |
| JP | 2004-285105 A | 10/2004 |

OTHER PUBLICATIONS

Material Safety Data Sheet, Butyl Stearate MSDS, Oct. 11, 2005, pp. 1-6.
Translation of JP 2001-294445.
Translation of JP 2002-226675.

*Primary Examiner* — Megan McCulley
(74) *Attorney, Agent, or Firm* — Kubovcik & Kubovcik

(57) ABSTRACT

A paste composition containing an inorganic filler, a resin and a solvent, wherein the paste composition is characterized in that it contains one or more solvents of which the boiling point is 160° C. or higher and an inorganic filler of which the mean particle diameter is 5 μm or smaller, and the total content of the solvent is 25 wt % or less based on the total amount of the paste composition, and a dielectric composition containing an inorganic filler and resin, wherein the inorganic filler includes inorganic fillers of at least two kinds of mean particle diameter, and the greatest mean particle diameter of said mean particle diameters is 0.1-5 μm and is 3 times or more the minimum mean particle diameter.

8 Claims, No Drawings

PASTE COMPOSITION AND DIELECTRIC COMPOSITION USING THE SAME

This application is a continuation-in-part of application Ser. No. 10/551,031, filed Sep. 27, 2005 now abandoned, which is a 371 of international application PCT/JP2004/004182, filed Mar. 25, 2004, which claims priority based on Japanese Patent Application Nos. 2003/101226 and 2003/186632, filed Apr. 4, 2003, and Jun. 30, 2003, respectively, and which are incorporated herein by reference.

FIELD OF THE INVENTION

This invention relates to a dielectric composition which shows preferable properties as a capacitor, an interlayer insulation material for a circuit material which functions as a capacitor and an optical wiring material.

BACKGROUND ART

In recent years, the densification of mounted circuit elements is progressing with the demand of downsizing of electronic equipment and of improvement in signal speed and capacity. However, it is becoming a problem that electrical noise increase causes data error. In order to suppress generating of this electrical noise and to stably operate a semiconductor device, it is important to supply a necessary current from a portion near the semiconductor device. For that, it is effective to arrange a capacitor with a large capacity as a decoupling capacitor directly under the semiconductor device.

Here, as a method of arranging a capacitor to a printed wiring board, there is also a method of arranging external capacitors, such as a chip capacitor to the printed wiring board. However, in respect of downsizing, it is advantageous that an inorganic filler is added to the inner layer of the printed wiring board, to thereby give a capacitor ability to the printed wiring board itself, and a method (JP-A-57852/1993 and JP-A-85413/1994) using a composite in which the inorganic filler and resin are mixed as an interlayer insulation material has been known. However, the relative dielectric constant of the composite obtained by the above-mentioned method was as low as about 10 to 20.

Although it is possible to increase the relative dielectric constant of the composite dielectric material containing the inorganic filler by increasing the addition of the inorganic filler, there is a problem that the relative dielectric constant does not increase even if the content of the inorganic filler increase, when the content of the inorganic filler exceeds 50 volume %. Furthermore, since its viscosity becomes too high if an inorganic filler having a high dielectric constant is mixed to a resin too much, a large quantity of solvent is usually needed.

The conventional high dielectric constant composition has been made by removing solvent from and solidifying the paste composition containing an inorganic filler, a resin, and a solvent (JP-A-158472/1998). However, when the content of solvent is large, faults such as decreasing heat resistance due to residual solvent and generating voids around its surface were brought about.

As an method of achieving a high relative dielectric constant, it is known to add a filler having two or more kinds of particle size to increase filling factor, to thereby make relative dielectric constant high (JP-A-88198/1978, JP-A-233669/2001). However, because the filler used therein has a mean particle diameter of the filler of 5 μm or larger as the greatest mean particle diameter and this filler had to be mixed with a resin, the thickness of the composite obtained could not be other than as thick as about 300 μm.

On the other hand, there is a technique using an inorganic filler with large particle diameter as a method of making the dielectric constant high. The dielectric constant of a filler depends on the crystal structure of the filler. Generally speaking, concerning inorganic crystal, as seen such as in barium titanate, the mismatch of center-of-gravities between the anion and the cation brings about a large dielectric constant. If the particle diameter of filler becomes small, generally saying, crystal grain size also becomes small and the surface energy of the particle becomes large, and the symmetricalness of the crystal structure increases in order to reduce energy of the whole system. If the symmetricalness of the crystal structure increases, because the mismatch between center-of-gravities of the anion and the cation becomes small, a dielectric constant becomes small. Therefore, the dielectric constant can be increased by using a filler with large particle diameter. This effect is remarkable especially in barium titanate. For example, there is an example (JP-A-293429/1996) in which barium titanate of 15 μm of mean particle diameters is used as a filler, and ethyl carbitol (the boiling point is 202° C.) is used as a solvent. However, since the particle size of the filler is large and the specific surface area of the filler is small, even if a solvent having high boiling point is used, removing solvent by heating can be carried out relatively in a short time and at low temperature. Then, solvent removal breaks out at a rate quicker than migration of the resin and the filler accompanied by contraction of the whole system, many voids generates. Generating voids causes a decrease of the dielectric constant. When a filler with a large mean particle diameter is used, although the dielectric constant of the filler itself becomes large, generating of voids can not be controlled as mentioned above even if a solvent having a high boiling point is used, and as a result, the dielectric constant was 52 and was not able to acquire a large value. Furthermore, since the filler of the large mean particle diameter of 15 μm is used (JP-A-293429/1996), the thickness had to be large as 25 μm, therefore the density of capacitance is as small as 1.8 $nF/cm^2$.

On the other hand, in order to make system to be mounted in the interior small and thin, a high density SiP (system in package) equipped with LSI with not only memory LSI but also LSI with many terminals is being rapidly developed, however, the capacitor build in this SiP is required strongly to be thin so that the thickness of this interlayer insulation material for capacitors to be 10 μm or thinner. However, by the conventional technique, the demand of making the thickness of 10 μm or thinner cannot be satisfied, and it cannot respond to the needs for making the thickness of the interlayer material thinner which has been rapidly increased in making the performances of mobile devices higher, such as a cellular phone.

Furthermore, since the capacitance of a capacitor is in inverse proportion to the thickness of interlayer insulation material, in view of increasing capacitance of a capacitor, it is also preferable to make the thickness of the interlayer insulation material thinner.

Furthermore, a low coefficient of linear expansion is an important basic property required in the interlayer insulation material. The coefficient of linear expansion of resin itself is 50 ppm/° C. or larger, and is very large as compared with the coefficient of linear expansion of the metal used as a wiring layer, for example, copper (17 ppm/° C.). Therefore, when an interlayer insulation material which consists only of resin is used, a fault by stress, such as an interlayer delamination and a disconnection of wiring arise due to the difference of coefficient of linear expansion with a wiring layer. On the other hand, since the coefficient of linear expansion can be made low if the resin and the inorganic filler are made into a composite, when the composite in which the inorganic filler and the resin are mixed is used as an interlayer insulation material, it becomes possible to bring the value of the coefficient of linear expansion close to that of the wiring layer. However, by the conventional method, since an inorganic filler could not be filled into sufficiently high filling factor, it was not able to lower the value the coefficient of linear expansion of the interlayer insulation material to almost near that of the wiring layer.

DISCLOSURE OF THE INVENTION

In view of this situation, in order to obtain a high dielectric constant composition with a low coefficient of linear expansion, and further, as an interlayer insulation material for large capacitance capacitors to be built in high density SiP, this invention provides a dielectric composition and an optical wiring material in which a sufficient thinness is attained.

That is, this invention is a paste composition containing an inorganic filler, a resin and a solvent of which boiling point is 160° C. or higher, characterized in that the solvent contains one or more solvents of which boiling point is 160° C. or higher and an inorganic filler of which mean particle diameter is 5 μm or smaller, and the total content of the solvent being 25 wt % or less based on the total amount of the paste composition.

Furthermore, another embodiment of this invention is a dielectric composition characterized in that it contains an inorganic filler and a resin, the inorganic filler contains inorganic fillers of at least two kinds of mean particle diameter, the greatest mean particle diameter of said mean particle diameters is 0.1-5 μm and the greatest mean particle diameter to the minimum mean particle diameter is 3 times or more.

According to this invention, it is possible to easily obtain a high dielectric constant composition of a relative dielectric constant of 50 or greater. Furthermore, since the composition of this invention has a low coefficient of linear expansion close to the coefficient of linear expansion of a wiring metal, when it is used as an interlayer insulation material, it is hard to produce a fault, such as an exfoliation between wiring layers or a disconnection of wiring, and it can obtain a capacitor which has high reliability. Furthermore, a thin film which has a uniform thickness and uniform physical properties can be obtained easily. Since this is suitable for large capacitance, it is useful as the capacitor to be built in high density SiP or as an interlayer insulation material for circuit board materials which functions as a capacitor.

BEST MODE FOR CARRYING OUT THE INVENTION

The paste composition of this invention is a paste composition characterized in that it consists of an inorganic filler, a resin, and a solvent, the inorganic filler contains an inorganic filler whose mean particle diameter is 5 μm or smaller, the solvent contains a solvent having a boiling point of 160° C. or higher and a total content of the solvent is 25 wt % or less based on the total amount of the paste composition.

Furthermore, this invention is a dielectric composition characterized in that it contains an inorganic filler and a resin, the inorganic filler contains inorganic fillers having at least two mean particle diameters, the mean particle diameter of the inorganic filler with the greatest mean particle diameter is 0.1-5 μm and the greatest mean particle diameter to the minimum mean particle diameter is 3 times or more.

The total content of the solvent in the paste composition of this invention needs to be 25 wt % or less based on the total amount of the paste composition. It is preferably 20 wt % or less, more preferably 10 wt % or less. In addition, 1 wt % or more is preferable. When the content of the solvent is 25 wt % or less, generating of voids during drying due to removing solvent is suppressed, and the relative dielectric constant of the dielectric composition can be made high. Furthermore, since the amount of voids which can cause moisture uptake is small, a change of material properties under the effect of moisture and water can be decreased. Furthermore, preservation durability is excellent. If the content of the solvents is more than 25 wt %, the void increases at drying and heat-curing processes for removing the solvent, and the relative dielectric constant of the dielectric composition decreases in many cases. If the content of the solvent is less than 1 wt %, since the content is small, the viscosity and homogeneity of the paste composition are not in the appropriate range.

In addition, as the filling factor of the inorganic filler becomes high, the effect by the above-mentioned content of the solvent becomes large, and in case where the inorganic filler is contained 85 wt % or more of the solid content in a paste composition, the effect of this invention is especially large.

As for the solvent used by this invention, a boiling point of at least one of them needs to be 160° C. or higher. It is preferably 180° C. or higher and more preferably 200° C. or higher. If the boiling point of a solvent is 160° C. or higher, generating of voids is suppressed and the relative dielectric constant of the dielectric composition can be made high. If the boiling point is lower than 160° C., since the speed of the volatilization of the solvent is quick, densification by the migration the components cannot follow the speed, and void portion increases, and the relative dielectric constant of the dielectric composition is likely to decrease. Furthermore, as for the solvent used by this invention, it is preferable that its boiling point is 300° C. or lower, and more preferably, it is 280° C. or lower. If the boiling point becomes higher than 280° C., the removing solvent must be done at an elevated temperature and the elevated temperature decomposes the resin thereby causing a decline of the dielectric characteristics etc. Furthermore, if it becomes higher than 300° C., decomposition of the resin become greater and the mechanical strength decreases. Although the solvent used for the paste composition of this invention may consist of one kind of solvent of which boiling point is 160° C. or higher, as long as it contains the solvent of which boiling point is 160° C. or higher, it may contain other solvent.

As the solvent of which boiling point is 160° C. or higher, mesitylene, acetonylacetone, methylcyclohexanone, diisobutyl ketone, methyl phenyl ketone, dimethylsulfoxide, γ-butyrolactone, isophorone, diethylformamide, dimethylacetamide, N-methylpyrrolidone, γ-butyrolactam, ethylene glycol acetate, 3-methoxy-3-methyl butanol and its acetate, 3-methoxybutyl acetate, 2-ethylhexyl acetate, oxalic esters, diethyl malonate, maleric esters, propylene carbonate, butyl cellosolve, ethyl carbitol, etc.

In this invention, the solvent containing an ester structure is preferably used, and a solvent containing a lactone structure is more preferable. The most preferable solvent is γ-butyrolactone. The boiling point used in this invention is the boiling point under one atmospheric pressure, i.e., the pressure of $1.013 \times 10^5$ N/m². Although the measurement of boiling point can be done by a well-known technique and it is not especially limited, it can be measured by using, for example, the boiling point meter of Swietoslawski.

Other solvents used in this invention can appropriately be chosen from what can dissolve the resin. As the solvent, for example, methyl cellosolve, N,N-dimethylformamide, methyl ethyl ketone, dioxane, acetone, cyclohexanone, cyclopentanone, isobutyl alcohol, isopropyl alcohol, tetrahydrofuran, toluene, chlorobenzene, trichloroethylene, benzyl alcohol, methoxymethylbutanol, ethyl lactate, propylene glycol, monomethyl ether and its acetate, etc. and an organic solvent mixture containing one or more thereof are preferably used.

As the shape of the inorganic filler, there are a spherical shape or the like, an ellipse spherical shape, a needle-like, tabular, a scale-like, a rod-like, etc., however, a spherical shape or the like is especially preferable. Because the spherical shape or the like has the least specific surface area, it is hard to cause trouble such as, when added to the resin, cohesion or lowering fluidity of the resin. One kind among these can be used alone; however, two or more kinds may be mixed and used.

In order to achieve a low coefficient of linear expansion and a high relative dielectric constant, it is preferable to add these inorganic fillers to the resin with high filling factor.

Organic resins generally used as an interlayer insulation material have a coefficient of linear expansion, for example, 30-50 ppm/° C. in case of a polyimide, and 50 ppm/° C. or greater in case of an epoxy resin. Although these are very large as compared with the coefficient of linear expansion of a wiring metal, for example, ppm/° C. of copper, it becomes possible to decrease their coefficient of linear expansion by mixing an inorganic filler.

Furthermore, in the dielectric composition which consists of the inorganic filler and the resin, the relative dielectric constant of the dielectric composition follows to the calculation for determination of the relative dielectric constant in composite, so-called the logarithmic mixture law (1) (SE-RAMIKKUSU ZAIRYOKAGAKU NYUUMON (OUYOU-HEN), Uchida Rokakuho Publishing Co., Ltd., which is the Japanese translation of W. D. Kingery, "Introduction to Ceramics, Second Edition", John Wiley & Sons, Inc., translated by Kazuzo Komatsu et al, p912). As the content of the inorganic filler which has a high dielectric constant increases, the relative dielectric constant of the dielectric composition obtained increases.

$$\log \varepsilon = \sum_i V_i \cdot \log \varepsilon_i \quad (1)$$

∈: relative dielectric constant of composite
∈i: relative dielectric constants of each component of composite
Vi: Volume fractions of each component of composite.

In order to make the resin contains the inorganic filler with a high filling factor, it is preferable to mix and use two or more kinds of filler of different mean particle diameters. In case where it is filled up with a filler of single particle size, if the filler is spherical shape or the like and when it is filled in high density, rhombus-like voids are generated between fillers, but other fillers cannot enter into these voids. However, if the other filler is smaller than the size of these voids, it can easily enter into these clearances further and the filling factor can be increased easily.

In this invention, regarding the inorganic filler contained, it is preferable that the difference ratio between the mean particle diameter of the inorganic filler which has the greatest mean particle diameter and the mean particle diameter of the inorganic filler which has the minimum mean particle diameter is as large as possible, and it is preferable that the greatest mean particle diameter to the minimum mean particle diameter is 3 times or more and further 5 times or more. If the difference ratio is small, the small filler cannot efficiently enter into voids between the large fillers. On the other hand, if the difference ratio is large, the small fillers are apt to cohere and its dispersing stability decreases. It is preferable that it is 30 times or less and further 10 times or less.

When using an inorganic filler with at least two mean particle diameters, it is preferable that the total volume of the inorganic filler with the greatest mean particle diameter Va and the total volume of the inorganic filler with the minimum mean particle diameter Vb satisfies $0.05 \leq Vb/(Va+Vb) < 0.5$. That is, the amount in volume ratio of the small filler is preferably 5% or more and less than 50% based on the total amount of the fillers. In case of less than 5%, the effect of entering into voids to increase the filling amount is hardly acquired, and in case of more than 50%, the volume occupied by the small filler becomes larger than the voids made by the large filler and the effect of increasing the filling amount by mutual invasion becomes small.

Besides these large and small fillers, a filler of other particle size may be mixed and even in case of three or more kinds, by choosing particle sizes and compounding ratio suitably, the effect of increasing in the filling factor by mixing fillers is acquired.

As for the inorganic filler used by this invention, it is preferable that the inorganic filler contains at least two kinds of inorganic fillers having different mean particle diameter and the mean particle diameter of the inorganic filler of the greatest mean particle diameter is 5 μm or smaller. More preferably, it is 2 μm or smaller and still more preferably it is 1 μm or smaller. In addition, 0.1 μm or larger is preferable and 0.2 μm or larger is more preferable and 0.3 μm or larger is still more preferable. Here, if a capacitor of a thickness of 10 μm or thinner is produced using an inorganic filler which has the greatest mean particle diameter larger than 5 μm, since the filler is apt to project on a film surface, it is difficult to obtain stable dielectric characteristics. On the other hand, when the mean particle diameter of the inorganic filler which has the greatest mean particle diameter is 2 μm or smaller, the filler in the filler dispersed liquid cannot sediment easily. Furthermore, when the mean particle diameter of the inorganic filler which has the greatest mean particle diameter is 1 μm or smaller, the filler is hard to sediment for a long term storage, and storage conditions may not be restricted. On the other hand, even it is intended to obtain a material with high relative dielectric constant, if the greatest mean particle diameter is smaller than 0.1 μm, the crystal structure tends to be symmetrical because the specific surface area of that filler is large, and a high dielectric constant phase is hard to be obtained, and that causes the relative dielectric constant of the dielectric composition to decrease. If the greatest mean particle diameter is 0.2 μm or larger, filler surface area becomes small and it is hard to cohere the filler dispersed paste and viscosity change is small, and neither kneading, dispersing nor coating processing can be influenced easily. Furthermore, if the mean particle diameter of the inorganic filler which has the greatest mean particle diameter is 0.3 μm or larger, because of the sufficiently large difference ratio between the mean particle diameter of the inorganic fillers which has the greatest mean particle diameter and the mean particle diameter of the inorganic filler which has the minimum mean particle diameter can be taken, the filling factor is not influenced.

Furthermore, in this invention, as for the mean particle diameter of the inorganic filler which has the minimum mean particle diameter, 0.01-0.1 μm is preferable. It is more preferable to use that of 0.04-0.06 µm. In addition, since it is necessary to take the difference ratio large between the greatest mean particle diameter and the minimum mean particle diameter, the inorganic filler which has the minimum mean particle diameter should be properly chosen from the above-mentioned range depending on the greatest mean particle diameter. As for the mean particle diameter of the inorganic filler which has the minimum mean particle diameter, the larger the difference ratio with the mean particle diameter of the inorganic filler which has the greatest mean particle diameter, the more the filling factor can be increased. For this reason, the mean particle diameter of the inorganic filler which has the minimum mean particle diameter is considered, from the preferable range of the mean particle diameter of the inorganic filler which has the greatest mean particle diameter, preferably to be 0.1 µm or smaller and more preferably to be 0.06 µm or smaller. If the mean particle diameter of the inorganic filler which has the minimum mean particle diameter is 0.04 µm or larger, re-cohesion after dispersing is hard to occur, and the dispersion stability of the paste is good. Furthermore, if the mean particle diameter of the inorganic filler which has the minimum mean particle diameter is 0.01 µm or larger, since a secondary cohesion of the filler with each other is hard to occur, a cohered material is likely to be loose and is easy to disperse.

Measurement of the mean particle diameter contained in the paste composition and the dielectric composition of this invention can be performed by XMA (X-ray Micro Analyzer) measurement and transmission electron microscope (TEM) observation for the ultrathin section which is obtained by cutting out a cross section in the direction of thickness of the thin film formed with the dielectric composition. Since the transmissivity of an electron ray to the inorganic filler and the resin differs, the inorganic filler and the resin are discriminable in the TEM observation image by the difference of the contrast. Identification of each inorganic filler in case two or more kinds of inorganic fillers are used can be performed by elemental analysis based on XMA measurement, and crystal structure analysis by an observation of electron beam diffraction. Thus, the distribution of the area of the obtained filler and the resin is determined by image analysis, the cross section of the inorganic filler is approximated as it is a circular and particle size can be computed from its area. The evaluation of the particle size can be performed with the TEM image of magnifications of 5000 times and 40000 times.

The calculated distributions of the particle size in the TEM image of magnification of 5000 times and in the TEM image of magnification of 40000 times are expressed with the histogram of 0.1 µm unit and with the histogram of 0.01 µm unit, respectively, and the central value of the class in which frequency shows the maximal value is considered to be the mean particle diameter. In this invention, "contains inorganic fillers of at least two kinds of mean particle diameter" means that there are two or more maximal values, i.e., there are two or more maximal values in the particle size distribution of the inorganic filler contained in the composition. Here, as an evaluation method of particle size distribution, a scanning electron microscope (SEM) may be used instead of TEM in the above-mentioned method.

Furthermore, as other method, mean particle diameter can be measured by, such as the dynamic light scattering method in which fluctuation of the scattered light by the Brownian motion of the filler is measured and the electrophoresis light scattering method in which the Doppler effect of the scattered light when carrying out electrophoresis of the filler is measured. As particle-size-distribution measuring device of the laser diffraction and scattering type, there are, for example, LA-920 of HORIBA, LTD., SALD-1100 of Shimadzu Corporation and MICROTRAC-UPA150 of NIKKISO CO.

As dielectric characteristics of inorganic filler, it is preferable to use an inorganic filler with the relative dielectric constant of 50-30000. If the inorganic filler having the relative dielectric constant of smaller than 50 is used, a dielectric composition with sufficiently high relative dielectric constant cannot be obtained. On the other hand, an inorganic filler with the relative dielectric constant greater than 30000 is not preferable since the temperature characteristic of the relative dielectric constant is likely to deteriorate. The relative dielectric constant of the inorganic filler here means the relative dielectric constant of the sintered product obtained by heating and firing the inorganic filler as raw material powder. The relative dielectric constant of the sintered product is measured with the following procedures. After mixing the inorganic filler with a binder resin like polyvinyl alcohol and an organic solvent or water to produce a paste-like composition, it is filled up into a pellet molding device and is dried to obtain a pellet-like solid. By firing the pellet-like solid, for example, at about 900-1200° C., the binder resin is decomposed and removed and the inorganic filler is sintered, a sintered product which consists only of inorganic components can be obtained. At this time, it is necessary that the void of the sintered product is small enough and the porosity calculated from theoretical density and an actually measured density to be 1% or lower. An upper and a lower electrodes are formed on this sintered product pellet, and the relative dielectric constant is calculated from the measurement result of capacitance and its dimension.

As an inorganic filler, there are a barium titanate type, a barium zirconate titanate type, a strontium titanate type, a calcium titanate type, a bismuth titanate type, a magnesium titanate type, a barium neodymium titanate type, a barium tin titanate type, a barium magnesium niobate type, a barium magnesium tantalate type, a lead titanate type, a lead zirconate type, a lead zirconate titanate type, a lead niobate type, a lead magnesium niobate type, a lead nickel niobate type, a lead tungstate type, a calcium tungstate type, a lead magnesium tungstate type, a titanium dioxide type, etc. A barium titanate type is a generic name including the solid solution which uses barium titanate as a base material in which a part of the elements is substituted for other element in a barium titanate crystal or other element intrudes in a crystal structure. The same can be said to each of other inorganic fillers, a barium zirconate titanate type, a strontium titanate type, a calcium titanate type, a bismuth titanate type, a magnesium titanate type, a barium neodymium titanate type, a barium tin titanate type, a barium magnesium niobate type, a barium magnesium tantalate type, a lead titanate type, a lead zirconate type, a lead zirconate titanate type, a lead niobate type, a lead magnesium niobate type, a lead nickel niobate type, a lead tungstate type, a calcium tungstate types, a lead magnesium tungstate types and a titanium dioxide type, and they are also generic names including the solid solution which are used as base materials.

It is especially preferable to use a filler which has a perovskite type crystal structure or a complex perovskite type crystal structure. Although one kind of these can be used independently or two or more kinds can be mixed and used, in view of dielectric characteristics, it is more preferable for the inorganic filler which has at least two kinds of different mean particle diameter to be the same chemical composition. In particular, when obtaining a dielectric composition which has high relative dielectric constant, in view of balance with commercial convenience, it is preferable to use the compound which mainly consists of barium titanate. However, in order to improve dielectric characteristics and temperature stability, a little addition of a shifter, a depressor agent, etc. may be added.

As for production method of the inorganic filler, there are methods such as the solid phase reaction method, the hydrothermal synthesis method, the supercritical hydrothermal synthesis method, the sol-gel process, and the oxalate method. As the production method of the inorganic filler which has the greatest mean particle diameter, it is preferable to use the solid phase reaction method or the oxalate method in view of high relative dielectric constant and quality stability. Furthermore, as the production method of the inorganic filler which has the minimum mean particle diameter, since it is easy to make the particle size small, it is preferable to use any of the hydrothermal synthesis method, the supercritical hydrothermal synthesis method or the sol gel process.

As the ratio of the inorganic filler and the resin contained in the paste composition and the dielectric composition of this invention, it is preferable that the ratio of the inorganic filler to the sum of the total volume of the inorganic filler and the total volume of the resin solid, Vf, is 50% or more and 95% or less. More preferably, it is 70% or more and 90% or less. At 50% or more of the ratio of the inorganic filler, Vf, sufficiently high relative dielectric constant and a small coefficient of thermal expansion are obtained. Furthermore, at 70% or more of the ratio of the inorganic filler, Vf, the effect using the inorganic filler with at least two mean particle diameters becomes remarkable, and high relative dielectric constant is obtained. On the other hand, at 95% or less of the inorganic filler content, Vf, a void generation inside the composition can be depressed and a relative dielectric constant high enough can be obtained, the moisture uptake resulting from an void is small, and physical properties cannot be easily influenced by water or moisture. Furthermore, when the inorganic filler content Vf is 90% or less, the degradation of the adhesive property after PCT (pressure cooker test), which is a durability acceleration test, is hard to occur.

Next, the resin used in this invention can be chosen from both of thermoplastic and thermosetting resins.

As the thermoplastic resins, polyphenylene ether, polyphenylene sulfide, polyethersulfone, polyetherimide, a liquid crystal polymer, polystyrene, polyethylene, a fluororesin, etc. can be used.

Furthermore, as the thermosetting resin, for example, besides an epoxy resin, a phenol resin, a siloxane resin, a polyimide, an acrylic resin, a cyanate resin, a benzocyclobutene resin, etc. resins generally used for an insulating layer of a printed wiring board can be used. In view of such as solder thermal resistance, it is preferable to use thermosetting resin and an epoxy resin is especially preferable from points, such as heat-curing shrinkage characteristics and viscosity.

Here, the epoxy resin is a resin which contains a prepolymer having two or more epoxy groups (oxirane ring) in the molecular structure. As for the prepolymer, it is preferable to have a biphenyl skeleton or a dicyclopentadiene skeleton in view of dielectric characteristics. Furthermore, it may contain a curing agent and, as the curing agent, a phenol novolak resin, a bisphenol A type novolak resin, an amino triazine compound, a naphthol compound, etc., can be used. Furthermore, it is also possible to add a curing accelerator, such as a metal chelate compound, such as triphenyl phosphine, a benzimidazole type compound, and tris (2,4-pentanedionato) cobalt.

The paste composition of this invention is obtained by dispersing the inorganic filler into the resin. For example, it is produced by the method of adding the inorganic filler into the resin solution followed by mixing and dispersing or by the let-down method which prepares a dispersion liquid in which the inorganic filler is dispersed in a suitable solvent beforehand, and mixes the dispersion liquid with a resin solution. Furthermore, the method of dispersing the inorganic filler into the resin or the solvent is not especially limited, for example, methods using, such as an ultrasonic distribution, a ball mill, a roll mill, a clearmix, a homogenizer, and a media disperser, can be used, however, in view of dispersibility, it is preferable to use a ball mill or a homogenizer. Beads type mills which are for example a ball mill and a homogenizer are good at dispersing of a low viscosity paste. Here low viscosity is 0.5 mPa·s or more to 10 Pa·s or less, preferably, 1 mPa·s or more to 10 Pa·s or less, and, most preferably, 1 mPa·s or more to 1 Pa·s or less. For a high viscosity paste a three roll mill is a suitable equipment for dispersing. Here high viscosity is several tens to a hundred Pa·s.

At dispersing the inorganic filler, in order to improve dispersibility, a surface treatment of the inorganic filler, an addition of a dispersant, an addition of a surfactant, an addition of a solvent, etc. may be carried out. As surface treatment of the inorganic filler, besides the treatments by various coupling agents such as a silane type, a titanium type and an aluminum type, by a fatty acid and by a phosphoric ester, etc., there are also a rosin treatment, acid treatment, basic treatment, etc. Furthermore, as an example of addition of a dispersant, there are dispersants which have acid groups such as phosphoric acid, a carboxylic acid, a fatty acid and esters thereof, and the compound which has a phosphoric ester skeleton is preferably used. A certain dispersant interacts with a certain inorganic filler and works to realize a good dispersion. And especially, the compound which has a phosphoric ester skeleton specially works very well as a dispersant of the inorganic filler consisting of a barium titanate type, a barium zirconate titanate type, a strontium titanate type, a calcium titanate type, a bismuth titanate type, a magnesium titanate type, a barium neodymium titanate type, a barium tin titanate type, a barium magnesium niobate type, a barium magnesium tantalate type, a lead titanate type, a lead zirconate type, a lead zirconate titanate type, a lead niobate type, a lead magnesium niobate type, a lead nickel niobate type, a lead tungstate type, a calcium tungstate type, a lead magnesium tungstate type, or a titanium dioxide type. As the result of the well dispersion, the viscosity of the paste containing the compound which has a phosphoric ester skeleton as a dispersant and the inorganic filler consisting of a barium titanate type, a barium zirconate titanate type, a strontium titanate type, a calcium titanate type, a bismuth titanate type, a magnesium titanate type, a barium neodymium titanate type, a barium tin titanate type, a barium magnesium niobate type, a barium magnesium tantalate type, a lead titanate type, a lead zirconate type, a lead zirconate titanate type, a lead niobate type, a lead magnesium niobate type, a lead nickel niobate type, a lead tungstate type, a calcium tungstate type, a lead magnesium tungstate type, or a titanium dioxide type can be made as low as several tens mPa·s. Such low viscosity paste can be used as a spin coating process which is a useful process for wet thin film fabrication on substrate. On the other hand a screen printing process is used for a high viscosity paste.

In addition, there are additions of nonionic, cationic and anionic surface active agents, of wetting agents such as a polycarboxylic acid, of a material having affinity to both, of a resin having a substituent of high steric hindrance. Furthermore, the polarity of the system at or after dispersing can be controlled by addition of a solvent. Furthermore, the paste composition may contain a stabilizer, a dispersant, a sedimentation inhibitor, a plasticizer, an antioxidant, etc., if needed.

As for the content of the inorganic filler in the solid content contained in the paste composition of this invention, it is preferably 85 wt % or more and 99 wt % or less, and more preferably it is 90 wt % or more, still more preferably it is 94 wt % or more. If the content of the inorganic filler is 85 wt % or more, it is easy to make the relative dielectric constant of the composition high. In this invention, as the content of the inorganic filler increases, it becomes easy to obtain a dielectric composition which has a high relative dielectric constant, and if it becomes 99 wt % or less, film forming becomes easy and dispersing of the inorganic filler becomes easy to be controlled. Here, the solid content means the total content of the inorganic filler, the resin, the additive, etc.

A combination of the compound which has a phosphoric ester skeleton and the specific inorganic filler makes the viscosity of the paste composition of this invention lower to several tens mPa·s, which can increase the amount of inorganic filler contained in the paste composition without spoiling the fluidity of the paste composition. Therefore, it is easy to make the relative dielectric constant of the composition high and make the coefficient of linear expansion of the composition low. Moreover, it is also easy to make a thin film of dielectric composition from the fluidic paste composition.

The dielectric composition of this invention is the dielectric composition which contains the inorganic filler and the resin, and the content of the inorganic filler is 85-99 wt % of the total solid content contained in the dielectric composition, and the porosity is below 30 volume %.

As the method of obtaining the dielectric composition of this invention, for example, there is a method of preparing the paste composition in which the inorganic filler was mixed with the resin at first, coating the paste composition to an adherend (for example, to a substrate), removing solvent and solidifying the composition to thereby obtain the dielectric composition. At this time, as the method of solidification, there are solidifications by, such as, heat and light. However, since the dielectric composition of this invention is not a sintered product, it is not necessary to completely decompose or remove the resin, and it is preferable to heat inside of the heat-resistant temperature of electronic parts, for example, a temperature of 500° C. or lower.

The porosity of the dielectric composition needs to be below 30 volume %, and is preferably below 20 volume %, more preferably below 10 volume %. When porosity is larger than 30 volume %, the ratio of the inorganic filler occupied in the layer becomes low, and a dielectric composition having a relative dielectric constant of 50 or greater is hard to obtain. Furthermore, it is also not preferable because of a decrease of insulation resistance, an increase of leakage current, a decrease of bending strength, etc.

Here, as the method of making porosity below 30 volume %, for example, although it can be attained by properly choosing an inorganic filler, a resin, and a solvent from those above-mentioned, it can be easily attained by that the paste composition contains at least one kind of solvent having a boiling point of 160° C. or higher, and make the content of the solvent 25% or less of the total paste composition.

Furthermore, for example, in order to make the porosity below 20 volume %, the porosity can be made below 20 volume %, if the paste composition contains at least one kind of solvent having a lactone structure. Among the solvent which has a lactone structure, γ-butyrolactone is the most preferable.

Although the measuring method of the porosity of the dielectric composition can be chosen suitably from, according to its purpose, a gas absorption method, a method of mercury penetration, a positron disappearance method, a low angle X-ray scattering method, etc., in this invention, from the density of the high dielectric constant composition, the porosity is determined by the following (1)-(3).

(1) Measuring the weight of the dielectric composition obtained by coating a paste composition on a substrate of a fixed form of which weight is measured and by removing the solvent to thereby solidify.

(2) Supposing the weight of substrate as W1, the weight of substrate and the dielectric composition as W2, the density of the dielectric composition as D, and the volume as V, the dielectric composition, $D=(W2-W1)/V$.

(3) Using an apparatus for thermogravimetry analysis (TGA), the dielectric composition was heated at the rate of 10° C./minute to 900° C. in the atmospheric-air circumstance, then the temperature was kept at 900° C. for 30 minutes to remove the binder, and the ratios of the inorganic filler and the resin contained in a dielectric composition were measured. Putting the volume of the inorganic filler, Wc, its specific gravity, ρc, the volume of the resin, Wp, its specific gravity, ρp, the porosity, P, then the porosity, P, can be determined by the following formula. Porosity P (volume %)=$\{(V-Wc/\rho c-Wp/\rho p)/V\} \times 100$.

The paste composition of this invention is preferably coated on an adherend (for example, a substrate) and subjected to removal of solvent to solidify, thereby to form a dielectric composition. As a method of applying a paste composition to the adherend, it is not limited especially and, for example, there are methods such as a spinner, a screen-stencil, a blade coater and a die coater. Thus, the dielectric composition can be easily obtained from the coated film by removal of solvent and heat curing, using a heating apparatus, such as a hot plate or an oven.

The adherend to be coated with the paste composition can be chosen, for example, from an organic type substrate, an inorganic type substrate, and these substrates on which a component material for a circuit has been arranged. As examples of organic type substrate, there are glass base copper clad laminates such as a glass cloth•epoxy copper clad laminate, composite copper clad laminates such as a non-woven glass•epoxy copper clad laminate, heat resistant thermoplastic substrates such as a polyetherimide resin substrate, a polyetherketone resin substrate and a polysulfone resin type substrate, flexible substrates such as a polyester film copper clad substrate and a polyimide film copper clad substrate.

Furthermore, as examples of inorganic type substrate, there are ceramic substrate such as an alumina substrate, an aluminium nitride substrate and a silicon carbide substrate, metal type substrate such as an aluminum substrate or an iron substrate. Examples of circuit materials, there are conductors containing a metal such as silver, gold or copper, insulators containing such as an inorganic type oxide, low dielectric materials containing a glassy material and/or a resin, highly dielectric materials containing a resin or inorganic filler and insulators containing a glassy material.

The shape of the dielectric composition of this invention is not especially limited and a film type, a rod type, a ball type, etc. can be chosen depending on its application, but it is especially preferable to be a film type. The film here includes a film, a sheet, a plate, a pellet, etc., too. Of course, it is also possible to perform pattern formation suitable for its application such as a via hole formation for electric connection, an adjustment of impedance, capacitance or internal stress and an imparting heat radiation function.

In the case of using the dielectric composition as a film, the thickness can be chosen within a range which fulfill a desired value of capacitance, but it is preferable that the thickness is 0.5 μm or thicker and 20 μm or thinner. More preferably, it is 2 μm or thicker and 20 μm or thinner. It is preferable that the film thickness is as thin as possible for securing a large capacitance as a capacitor, but if it is thinner than 0.5 μm, it is likely to generate a pinhole etc. and an electric insulation becomes hard to be obtained. Furthermore, if it is 2 μm or thicker, a dielectric loss tangent is hard to increase after PCT (pressure cooker test) which is a durability acceleration test. Furthermore, when thickness exceeds 20 μm, not only a great relative dielectric constant is needed in order to obtain sufficient capacitor performance, but also increasing packing density may become difficult.

Although the application of the paste composition of this invention and a dielectric composition is not especially limited, for example, besides it is used as a high dielectric constant layer for an interlayer insulation material of a built-in capacitor of a printed-circuit board, applications to various electronic parts and equipments are also possible such as for an interlayer insulation film of a multilayer substrate, a frequency filter, an antenna for wireless, electromagnetic shielding, an optical wiring material.

The dielectric composition of this invention is preferably used as an interlayer insulation material for capacitors. The method of forming the interlayer insulation material for capacitors using the dielectric composition is not especially limited. For example, as described above, after forming a high dielectric material on a substrate, it can be suitably obtained by forming an electrode.

As the capacitance per area of the interlayer insulation material for capacitors produced using the dielectric composition of this invention, it is preferable that it is in the range of greater than 5 nF/cm$^2$. More preferably, it is in the range of greater than 10 nF/cm$^2$. If the capacitance is smaller than 5 nF/cm$^2$, when it is used as a decoupling capacitor, the decoupling with the power source of the whole system becomes insufficient and it cannot work sufficiently as a decoupling capacitor.

It is preferable that the change of capacitance depending on temperature and the change of capacitance within the field are small for designing a circuit. It is preferable that the change of capacitance depending on a temperature is as small as possible, for example, it is preferable to meet X7R property (at a temperature of −55 to 125° C., the deviation of capacitance to be less than ±15%). As for the change of capacitance within a layer, it is preferable that it is 5% or less (average of the capacitance −5% capacitance≤average of the capacitance+5%) to the average value.

Furthermore, in order to reduce the power loss of the power source, it is preferable that the dielectric loss tangent of the capacitor is in the range of 0.01-5% and, more preferably, it is in the range of 0.01-1%. Here, the electrical properties such as the capacitance and the dielectric loss tangent are values measured at a frequency of 20 k-1 GHz.

The dielectric composition of this invention can be preferably used also as an optical wiring material. The optical wiring is a wiring in which signal transmission between each of, such as, LSIs, modules, and boards, is not performed with the usual electrical signal, but is performed with an optical signal. When forming an optical wiring on a mounting substrate or its interior, a structure in which a high refractive index layer is sandwiched with low refractive index layers is taken. It is also possible to substitute the low refractive index layer with a space. When using as an optical wiring material, in order to make the scattering of light for signal transmissions, which travels the inside of the optical wiring, small, it is important to use a sufficiently small inorganic filler compared to the wavelength of the light, and it is preferable to choose particle with a particle size of ¼ or less of the wavelength of light. Furthermore, it is possible to control the refractive index, the temperature dependency of the refractive index and the coefficient of thermal expansion by selection of the inorganic filler material, its content, and the selection of the resin material. Due to these facts, it becomes possible to widely select the substrate material which forms an optical wiring layer, it also becomes possible to use not only conventionally used inorganic materials such as silicon and ceramics, but also to use a substrate which consists of the organic material.

Hereafter, this invention is explained by examples, but this invention is not limited thereto.

Example 1

A dispersion liquid A-1 was prepared by mixing and dispersing under ice-cooling for 1 hour using a homogenizer, barium titanate filler (BT-05 of SAKAI CHEMICAL INDUSTRY CO., LTD., mean particle diameter: 0.5 μm) 323 weight parts and γ-butyrolactone 18 weight parts. An epoxy resin solution B-1 was prepared by mixing an epoxy resin (EPPN502H of NIPPON KAYAKU CO., LTD.) 10 weight parts, a phenol novolak resin (TD-2131 of DAINIPPONN INK AND CHEMICALS, Inc.) 10 weight parts, a curing-accelerator (triphenyl phosphine of HOKKO CHEMICAL INDUSTRY CO., LTD.) 0.6 weight parts and γ-butyrolactone 20 weight parts. A paste composition C-1 was prepared by mixing, using a ball mill, the dispersion liquid A-1 and the epoxy resin solution B-1. The boiling point of γ-butyrolactone is 204° C. This paste composition C-1 was coated by a die coater on an aluminum substrate with a thickness of 300 μm and after drying in an oven at 80° C. for 15 minutes, it was cured at 175° C. for 1 hour, to thereby obtain a high dielectric constant composition of 10 μm thickness.

Next, an aluminum electrode with a diameter of 11 mm was formed on this high dielectric constant composition with vapor deposition, and the dielectric characteristics at 1 MHz was measured using an impedance analyzer HP4284A and a sample holder HP16451B (both are sold by Hewlett Packard) according to JIS K 6911 and the results are shown in Table 1. The relative dielectric constant of the high dielectric constant composition was 82, the dielectric loss tangent is 2.8% and the capacitance per area was 7.3 nF/cm$^2$. The porosity was 9 volume %.

Example 2

The paste composition C-1 was prepared in the same way as Example 1. Next, 22.6 weight parts of γ-butyrolactone was added so that the content of the solvent in the paste composition might become 15 wt %, and a paste composition C-2 was prepared. Then, according to the method of Example 1, a high dielectric constant composition was prepared and the result of evaluation of its dielectric characteristics is shown in Table 1. The relative dielectric constant of the high dielectric constant composition was 73, the dielectric loss tangent was 3.4% and the capacitance per area was 4.3 nF/cm$^2$. The porosity was 12 volume %.

Examples 3-4

Paste compositions C-3 and C-4 with different solvent content were prepared by further adding γ-butyrolactone to the paste composition C-1 so that the content of the solvent in the paste compositions might become 20 and 25 wt %, respectively. Then, according to the method of Example 1, high dielectric constant compositions were prepared and the result of evaluation of its dielectric characteristics is shown in Table 1. The high dielectric constant compositions having the porosity below 20 volume % and the relative dielectric constant of 50 or greater was obtained.

Comparative Example 1

γ-butyrolactone was added to the paste composition C-1, and a paste composition D-1 whose content of the solvent in the paste composition is 40 wt % was prepared. Then, according to the method of Example 1, a high dielectric constant composition was prepared and the result of evaluation of its dielectric characteristics is shown in Table 4. When the content of the solvent contained in the paste composition was 40 wt % of the total quantity, the porosity was 31 volume % and the relative dielectric constant was 41.

Example 5

Barium titanate (BT-05 of SAKAI CHEMICAL INDUSTRY CO., LTD., mean particle diameter: 0.5 μm) 323 weight parts, a dispersant (BYK-W903 of BYK-Chemie Japan KK) 0.2 weight parts and γ-butyrolactone 18 weight parts were kneaded using a homogenizer, and a dispersion liquid A-2 was obtained. The dispersion liquid A-2 and the epoxy resin solution B-1 were mixed using a ball mill, and a paste composition C-5 was prepared. Then, according to the method of Example 1, a high dielectric constant composition was prepared and the result of evaluation of its dielectric characteristics is shown in Table 1. The relative dielectric constant was 102, the dielectric loss tangent was 3.6%, the capacitance per area was 11.3 nF/cm$^2$, and the porosity was 6 volume %.

Example 6

γ-butyrolactone was added to the paste composition C-5, and the paste composition C-6 having a solvent content in the paste composition of 15 wt % was prepared. Then, according to the method of Example 1, a high dielectric constant composition was prepared and the result of evaluation of its dielectric characteristics is shown in Table 1. The relative dielectric constant was 95, the dielectric loss tangent was 3.1%, the capacitance per area was 8.4 nF/cm$^2$, and the porosity was 7 volume %.

Example 7

Except that the solvent was N-methyl-2-pyrrolidone, a paste composition C-7 was prepared in the same way as that of the paste composition C-2. The boiling point of N-methyl-2-pyrrolidone is 202° C. Then, according to the method of Example 1, a high dielectric constant composition was prepared and the result of evaluation of its dielectric characteristics is shown in Table 1. The relative dielectric constant was 58, the dielectric loss tangent was 4.6%, the capacitance per area was 5.3 nF/cm$^2$, and the porosity was 26 volume %.

Example 8

Except that the solvent was ethylene glycol diacetate, a paste composition C-8 was prepared in the same way as that of the paste composition C-2. The boiling point of ethylene glycol diacetate is 190° C. Then, according to the method of Example 1, a high dielectric constant composition was prepared and the result of evaluation of its dielectric characteristics is shown in Table 1. The relative dielectric constant was 64, the dielectric loss tangent was 4.8%, the capacitance per area was 5.7 nF/cm$^2$, and the porosity was 21 volume %.

Example 9

Except that the solvent was ethyl carbitol, a paste composition C-9 was prepared in the same way as that of the paste composition C-2. The boiling point of ethyl carbitol is 202° C. Then, according to the method of Example 1, a high dielectric constant composition was prepared and the result of evaluation of its dielectric characteristics is shown in Table 2. The relative dielectric constant was 50, the dielectric loss tangent was 2.2%, the capacitance per area was 4.4 nF/cm$^2$, and the porosity was 30 volume %.

Comparative Example 2

Except that the solvent was morpholine, a paste composition D-2 was prepared in the same way as that of the paste composition C-2. The boiling point of morpholine is 128° C. Then, according to the method of Example 1, a high dielectric constant composition was prepared and the result of evaluation of its dielectric characteristics is shown in Table 4. The relative dielectric constant was 35, the dielectric loss tangent was 5.8%, and the capacitance per area was 2.6 nF/cm$^2$, and was inferior in electrical property. The porosity was 32 volume %.

Comparative Example 3

Except that the solvent was propylene glycol monomethylether acetate, a paste composition D-3 was prepared in the same way as that of the paste composition C-2. The boiling point of propylene glycol monomethyl acetate is 146° C. Then, according to the method of Example 1, a high dielectric constant composition was prepared and the result of evaluation of its dielectric characteristics is shown in Table 4. The relative dielectric constant was 46, the dielectric loss tangent was 4.7%, and the capacitance per area was 2.7 nF/cm$^2$, and was inferior in the electrical property. The porosity was 35 volume %.

Example 10

Barium titanate (BT-05 of SAKAI CHEMICAL INDUSTRY CO., LTD., mean particle diameter: 0.5 μm) 494 weight parts and γ-butyrolactone 71 weight parts were kneaded using a homogenizer, and a dispersion liquid A-3 was obtained. Dispersion liquid A-3 and the epoxy resin solution B-1 were mixed using a ball mill, and the paste composition C-10 was prepared. Then, according to the method of Example 1, a high dielectric constant composition was prepared and the result of evaluation of its dielectric characteristics is shown in Table 2. The relative dielectric constant was 79, the dielectric loss tangent was 3.4%, the capacitance per area was 5.8 nF/cm$^2$, and the porosity was 13 volume %.

Example 11

Barium titanate (BT-05 of SAKAI CHEMICAL INDUSTRY CO., LTD., mean particle diameter: 0.5 μm) 185 weight parts and γ-butyrolactone 16 weight parts were kneaded using a homogenizer, and a dispersion liquid A-4 was obtained. Dispersion liquid A-4 and the epoxy resin solution B-1 were mixed using a ball mill, and a paste composition C-11 was prepared. Then, according to the method of Example 1, a high dielectric constant composition was prepared and the result of evaluation of its dielectric characteristics is shown in Table 2. The relative dielectric constant was 76, the dielectric loss tangent was 3.2%, the capacitance per area was 8.4 nF/cm$^2$, and the porosity was 5 volume %.

Example 12

A paste composition C-12 was prepared in the same way as example 2 except using barium titanate (SB05 of Toho Titanium Co., Ltd., mean particle diameter: 0.5 μm) as the high dielectric constant inorganic filler. Then, according to the method of Example 1, a high dielectric constant composition was prepared and the result of evaluation of its dielectric characteristics is shown in Table 2. The relative dielectric constant was 70, the dielectric loss tangent was 2.9%, the capacitance per area was 6.2 nF/cm$^2$, and the porosity was 14 volume %.

Example 13

A paste composition C-13 was prepared in the same way as example 2 except using strontium titanate (ST-03 of SAKAI CHEMICAL INDUSTRY CO., LTD., mean particle diameter: 0.3 μm) as the high dielectric constant inorganic filler. Then, according to the method of Example 1, a high dielectric constant composition was prepared and the result of evaluation of its dielectric characteristics is shown in Table 2. The relative dielectric constant was 65, the dielectric loss tangent was 1.2%, the capacitance per area was 3.8 nF/cm$^2$, and the porosity was 14 volume %.

Examples 14-16

Paste composition C-14-16 was prepared in the same way as example 2 except using the resin and the curing agent which are shown in Table 2. Then, high dielectric constant compositions were prepared and the result of evaluation of their dielectric characteristics is shown in Table 2. The high dielectric constant compositions having relative dielectric constant of 50 or greater were obtained.

Examples 17-18

Paste compositions C-17-18 were prepared using, as the resin, a polyimide resin ("Semicofine" SP 341 of Toray Industries, Inc.) and a polyethersulfone (5003P of Sumitomo Chemical Co., Ltd.). Then, high dielectric constant compositions shown in Table 3 were prepared and their dielectric characteristics were evaluated. The result is shown in Table 3. High dielectric constant compositions having a relative dielectric constant of 50 or greater were obtained.

Example 19

A dispersion liquid A-5 was obtained by mixing a barium titanate filler (BT-05 of SAKAI CHEMICAL INDUSTRY CO., LTD., mean particle diameter: 0.5 μm) 323 weight parts and γ-butyrolactone 36 weight parts under ice-cooling for 1 hour using a homogenizer. An epoxy resin (EPPN502H of NIPPON KAYAKU CO., LTD.) 12.8 weight parts, a phenol novolak resin (TD-2131 of DAINIPPON INK AND CHEMICALS, Inc.) 7.8 weight parts, a curing-accelerator (triphenyl phosphine of HOKKO CHEMICAL INDUSTRY CO., LTD.) 0.2 weight parts and γ-butyrolactone 24.8 weight parts were mixed, and an epoxy resin solution B-2 was obtained. The dispersion liquid A-5 and the epoxy resin solution B-2 were mixed using a ball mill, and a paste composition C-19 was prepared. Then, according to the method of Example 1, a high dielectric constant composition was prepared and the result of evaluation of its dielectric characteristics is shown in Table 3. The relative dielectric constant was 73, the dielectric loss tangent was 3.4%, the capacitance per area was 4.3 nF/cm$^2$, and the porosity was 12 volume %.

Example 20

The barium titanate (BT-05 of SAKAI CHEMICAL INDUSTRY CO., LTD., mean particle diameter: 0.5 μm) 323 weight parts, a dispersant (BYK-W9010 of BYK-Chemie Japan KK, a copolymer with an acid group which has phosphoric-ester skeleton) 0.2 weight parts and γ-butyrolactone 36 weight parts were kneaded using a homogenizer, and a dispersion liquid A-6 was obtained. Dispersion liquid A-6 and the epoxy resin solution B-2 were mixed using a ball mill, and the paste composition C-20 was prepared. Then, according to the method of Example 1, a high dielectric constant composition was prepared and the result of evaluation of its dielectric characteristics is shown in Table 3. The relative dielectric constant was 95, the dielectric loss tangent was 3.1%, the capacitance per area was 8.4 nF/cm$^2$, and the porosity was 7 volume %.

Example 21

An epoxy resin (NC3000 of NIPPON KAYAKU CO., LTD.) 15.3 weight parts, a phenol novolak resin ("KAYA-HARD" TPM of NIPPON KAYAKU CO., LTD. (new name: "KAYAHARD" KTG-105)) 5.3 weight parts, a curing-accelerator (triphenyl phosphine of HOKKO CHEMICAL INDUSTRY CO., LTD.) 0.2 weight parts and γ-butyrolactone 24.7 weight parts were mixed, and an epoxy resin solution B-3 was obtained. The dispersion liquid A-2 and the epoxy resin solution B-3 were mixed using a ball mill, and a paste composition C-21 was prepared. Then, according to the method of Example 1, a high dielectric constant composition was prepared and the result of evaluation of its dielectric characteristics is shown in Table 3. The relative dielectric constant was 76, the dielectric loss tangent was 2.8%, the capacitance per area was 5.6 nF/cm$^2$, and the porosity was 14 volume %.

Example 22

Barium titanate (BT-05 of SAKAI CHEMICAL INDUSTRY CO., LTD., mean particle diameter: 0.5 μm) 62.3 weight parts, barium titanate (HPB-1000 of TPL Inc., mean particle diameter: 0.059 μm) 21.9 weight parts, γ-butyrolactone 15 weight parts and a dispersant (BYK-W9010 of BYK-Chemie Japan KK, a copolymer with an acid group having a phosphoric ester skeleton) 0.8 weight parts were kneaded using a homogenizer, and a dispersion liquid A-7 was obtained. An epoxy resin (EPPN502H of NIPPON KAYAKU CO., LTD.) 2.2 weight parts, a phenol novolak resin (TD-2131 of DAINIPPON INK AND CHEMICALS, Inc.) 1.4 weight parts, a curing-accelerator (triphenyl phosphine sold by HOKKO CHEMICAL INDUSTRY CO., LTD.) 0.04 weight parts and γ-butyrolactone 7.1 weight parts were mixed, and an epoxy resin solution B-4 was obtained. The dispersion liquid A-7 and the epoxy resin solution B-4 were mixed using a ball mill, and a paste composition C-22 was prepared. Then, according to the method of Example 1, a high dielectric constant composition was prepared and the result of evaluation of its dielectric characteristics is shown in Table 6. The relative dielectric constant was 123, the dielectric loss tangent was 3.1, the capacitance was 10.9 nF/cm² and the porosity was 4 volume %.

Example 23

An epoxy resin (NC-3000 of NIPPON KAYAKU CO., LTD.) 2.6 weight parts, a phenol novolak resin ("KAYAHARD" TPM of NIPPON KAYAKU CO., LTD. (new name: "KAYAHARD" KTG-105)) 0.9 weight parts, a curing-accelerator (triphenyl phosphine of HOKKO CHEMICAL INDUSTRY CO., LTD.) 0.04 weight parts and γ-butyrolactone 7.1 weight parts were mixed and an epoxy resin solution B-5 was obtained. The dispersion liquid A-7 and the epoxy resin solution B-5 were mixed using a ball mill, and a paste composition C-23 was prepared. Then, according to the method of Example 1, a high dielectric constant composition was prepared and the result of evaluation of its dielectric characteristics is shown in Table 6. The relative dielectric constant was 121, the dielectric loss tangent was 2.6%, the capacitance per area was 10.7 nF/cm² and the porosity was 4 volume %.

Example 24

Except that the solvent was ethylene glycol diacetate, a paste composition C-24 was prepared in the same way as example 23. The boiling point of ethylene glycol diacetate is 190° C. Then, according to the method of Example 1, a high dielectric constant composition was prepared and the result of evaluation of its dielectric characteristics is shown in Table 6. The relative dielectric constant was 95, the dielectric loss tangent was 3.1%, the capacitance per area was 8.4 nF/cm² and the porosity was 8 volume %.

Example 25

Except that the solvent was diethyl malonate, the paste composition C-25 was prepared in the same way as example 23. The boiling point of diethyl malonate is 199° C. Then, according to the method of Example 1, a high dielectric constant composition was prepared and its dielectric characteristics were evaluated. The relative dielectric constant was 85, the dielectric loss tangent was 2.7%, the capacitance per area was 7.5 nF/cm² and the porosity was 9 volume %.

Example 26

Except that the solvent was ethyl carbitol, a paste composition C-26 was prepared in the same way as example 23. The boiling point of ethyl carbitol is 202° C. Then, according to the method of Example 1, a high dielectric constant composition was prepared and dielectric characteristics were evaluated. The relative dielectric constant was 99, the dielectric loss tangent was 2.9%, the capacitance per area was 8.8 nF/cm², and the porosity was 7 volume %.

Example 27

Except that the solvent was 4-methylcyclohexanone, a paste composition C-27 was prepared in the same way as example 23. The boiling point of 4-methylcyclohexanone is 169° C. Then, according to the method of Example 1, a high dielectric constant composition was prepared and the result of evaluation of its dielectric characteristics is shown in Table 6. The relative dielectric constant was 79, the dielectric loss tangent was 2.1%, the capacitance per area was 7.0 nF/cm² and the porosity was 12 volume %.

Example 28

Except that the solvent was isophorone, a paste composition C-28 was prepared in the same way as example 23. The boiling point of isophorone is 215° C. Then, according to the method of Example 1, a high dielectric constant composition was prepared and the result of evaluation of its dielectric characteristics is shown in Table 6. The relative dielectric constant was 76, the dielectric loss tangent was 2.2%, the capacitance per area was 6.7 nF/cm² and the porosity was 11 volume %.

Example 29

Except that the solvent was diethylformamide, the paste composition C-29 was prepared in the same way as example 23. The boiling point of diethylformamide is 177° C. Then, according to the method of Example 1, a high dielectric constant composition was prepared and the result of evaluation of its dielectric characteristics is shown in Table 6. The relative dielectric constant was 70, the dielectric loss tangent was 2.3%, the capacitance per area was 6.2 nF/cm², and the porosity was 15 volume %.

Example 30

Except that the solvent was dimethylacetamide, the paste composition C-30 was prepared in the same way as example 23. The boiling point of dimethylacetamide is 165° C. Then, according to the method of Example 1, a high dielectric constant composition was prepared and its dielectric characteristics were evaluated. The relative dielectric constant was 79, the dielectric loss tangent was 2.3%, the capacitance per area was 7.0 nF/cm², and the porosity was 11 volume %.

Synthetic Example 1

Dispersion Liquid X-1

A barium titanate filler (BT-05 of SAKAI CHEMICAL INDUSTRY Co., Ltd., mean particle diameter: 0.5 μm) 5328 weight parts, a barium titanate filler (HPB-1000 of TPL, Inc., mean particle diameter: 0.059 μm) 1872 weight parts, γ-butyrolactone 928 weight parts and a dispersant (BYK-W9010 of BYK-Chemie Japan KK: a copolymer having an acid group with a phosphoric-ester skeleton) 72 weight parts were mixed and dispersed under ice-cooling for 1 hour using a homogenizer, and a dispersion liquid X-1 was obtained.

Synthetic Example 2

Dispersion Liquid X-2

A barium titanate filler (BT-05 of SAKAI CHEMICAL INDUSTRY Co., Ltd., mean particle diameter: 0.5 μm) 5328 weight parts, a barium titanate filler (K-Plus16 of Cabot Corp., mean particle diameter: 0.06 μm) 1872 weight parts, γ-butyrolactone 928 weight parts and a dispersant (a copolymer having an acid group with a phosphoric-ester skeleton: BYK-W9010 of BYK-Chemie Japan KK) 72 weight parts were mixed and dispersed under ice-cooling for 1 hour using a homogenizer, and a dispersion liquid X-2 was obtained.

Synthetic Example 3

Dispersion Liquid X-3

A barium titanate filler (BT-02 of SAKAI CHEMICAL INDUSTRY Co., Ltd., mean particle diameter: 0.18 μm) 5328 weight parts, a barium titanate filler (HPB-1000 of TPL Inc., mean particle diameter: 0.059 μm) 1872 weight parts, γ-butyrolactone 928 weight parts and a dispersant (a copolymer having an acid group with a phosphoric-ester skeleton: BYK-W9010 of BYK-Chemie Japan KK) 72 weight parts were mixed and dispersed under ice-cooling for 1 hour using a homogenizer, and a dispersion liquid X-3 was obtained.

Synthetic Example 4

Dispersion Liquid X-4

A barium titanate filler (BT-03 of SAKAI CHEMICAL INDUSTRY Co., Ltd., mean particle diameter: 0.28 μm) 532.8 weight parts, a barium titanate filler (HPB-1000 of TPL Inc., mean particle diameter: 0.059 μm) 1872 weight parts, γ-butyrolactone 928 weight parts and a dispersant (a copolymer having an acid group with a phosphoric-ester skeleton: BYK-W9010 of BYK-Chemie Japan KK) 72 weight parts were mixed and dispersed under ice-cooling for 1 hour using a homogenizer, and a dispersion liquid X-4 was obtained.

Synthetic Example 5

Dispersion Liquid X-5

A barium titanate filler (BT-HP3 of KCM Corporation, mean particle diameter: 1.2 μm) 5328 weight parts, a barium titanate filler (HPB-1000 of TPL Inc., mean particle diameter: 0.059 μm) 1872 weight parts, γ-butyrolactone 928 weight parts and a dispersant (a copolymer having an acid group with a phosphoric-ester skeleton: BYK-W9010 of BYK-Chemie Japan KK) 72 weight parts were mixed and dispersed under ice-cooling for 1 hour using a homogenizer, and a dispersion liquid X-5 was obtained.

Synthetic Example 6

Dispersion Liquid X-6

A barium titanate filler (BT-SA of KCM Corporation, mean particle diameter: 2.1 μm) 5328 weight parts, a barium titanate filler (HPB-1000 of TPL Inc., mean particle diameter: 0.059 μm) 1872 weight parts, γ-butyrolactone 928 weight parts and a dispersant (a copolymer having an acid group with a phosphoric-ester skeleton: BYK-W9010 of BYK-Chemie Japan KK) 72 weight parts were mixed and dispersed under ice-cooling for 1 hour using a homogenizer, and a dispersion liquid X-6 was obtained.

Synthetic Example 7

Dispersion Liquid X-7

A barium titanate filler (BT-05 of SAKAI CHEMICAL INDUSTRY Co., Ltd., mean particle diameter: 0.5 μm) 6067 weight parts, a strontium titanate filler (HPS-2000 of TPL. Inc., mean particle diameter: 0.045 μm) 1613 weight parts, γ-butyrolactone 1523 weight parts and a dispersant (a copolymer having an acid group with a phosphoric-ester skeleton: BYK-W9010 of BYK-Chemie Japan KK) 77 weight parts were mixed and dispersed under ice-cooling for 1 hour using a homogenizer, and a dispersion liquid X-7 was obtained.

Synthetic Example 8

Dispersion Liquid X-8

A barium titanate filler (BT-05 of SAKAI CHEMICAL INDUSTRY Co., Ltd., mean particle diameter: 0.5 μm) 5261 weight parts, a titanium oxide filler (HT0514 of Toho Titanium Co., Ltd., mean particle diameter: 0.2 μm) 2419 weight parts, γ-butyrolactone 1523 weight parts and a dispersant (a copolymer having an acid group with a phosphoric-ester skeleton: BYK-W9010 of BYK-Chemie Japan KK) 77 weight parts were mixed and dispersed under ice-cooling for 1 hour using a homogenizer, and a dispersion liquid X-8 was obtained.

Synthetic Example 9

Dispersion Liquid X-9

A lead type filler (Y5V183U of Ferro, mean particle diameter: 0.9 μm) 6695 weight parts, a barium titanate filler (HPB-1000 of TPL Inc., mean particle diameter: 0.059 μm) 1145 weight parts, γ-butyrolactone 1722 weight parts and a dispersant (a copolymer having an acid group with a phosphoric-ester skeleton: BYK-W9010 of BYK-Chemie Japan KK) 78 weight parts were mixed and dispersed under ice-cooling for 1 hour using a homogenizer, and a dispersion liquid X-9 was obtained.

Synthetic Example 10

Dispersion Liquid X-10

A barium titanate filler (BT-05 of SAKAI CHEMICAL INDUSTRY Co., Ltd., mean particle diameter: 0.5 μm) 7200 weight parts, γ-butyrolactone 928 weight parts and a dispersant (a copolymer having an acid group of a phosphoric-ester type: BYK-W9010 of BYK-Chemie Japan KK) 72 weight parts were mixed and dispersed under ice-cooling for 1 hour using a homogenizer, and a dispersion liquid X-10 was obtained.

Synthetic Example 11

Dispersion Liquid X-11

A barium titanate filler (BTHP-8YF of KCM Corporation, mean particle diameter: 7 μm) 5328 weight parts, a barium titanate filler (BT-05 of SAKAI CHEMICAL INDUSTRY Co., Ltd., mean particle diameter: 0.5 μm) 1872 weight parts, γ-butyrolactone 928 weight parts and a dispersant (a copolymer having an acid group with a phosphoric-ester skeleton: BYK-W9010 of BYK-Chemie Japan KK) 72 weight parts were mixed and dispersed under ice-cooling for 1 hour using a homogenizer, and a dispersion liquid X-11 was obtained.

Synthetic Example 12

Dispersion Liquid X-12

After dispersing a barium titanate filler (the product made from KCM Corporation, BT-SA, a mean particle diameter: 2.1 μm) in an acrylic resin binder using a ball mill, a secondary particle was obtained by cohesion/solidification of the primary particle using a spray dryer. Next, after calcinating this at 1200° C. in atmospheric air for 6 hours and grinded in a mortar, it was classified by screens of 500 mesh and 300 mesh to obtain a barium titanate filler A having a mean particle diameter of 40 μm. The dynamic scattering type particle-size-distribution measuring device (LB-500 of HORIBA, LTD.) was used for measurement of the mean the particle diameter. This barium titanate filler A 5328 weight parts, the barium titanate filler B (BT-SA of KCM Corporation, mean particle diameter: 2.1 μm) 1872 weight parts, γ-butyrolactone 928 weight parts and a dispersant (a copolymer having an acid group with a phosphoric-ester skeleton: BYK-W9010 of BYK-Chemie Japan KK) 72 weight parts were mixed and dispersed under ice-cooling for 1 hour using a homogenizer and a dispersion liquid X-12 was obtained.

Synthetic Example 13

Dispersion Liquid X-13

A barium titanate filler C of 20 μm of mean particle diameters was prepared in the same way as that of the barium titanate filler A of the Synthetic example 12 except using the screens of 1000 mesh and 600 mesh. This barium titanate filler C 5328 weight parts, the barium titanate filler B (BT-SA of KCM Corporation, mean particle diameter: 2.1 μm) 1872 weight parts, γ-butyrolactone 928 weight parts and a dispersant (a copolymer having an acid group with a phosphoric-ester skeleton: BYK-W9010 of BYK-Chemie Japan KK) 72 weight parts were mixed and dispersed under ice-cooling for 1 hour using a homogenizer and a dispersion liquid X-13 was obtained.

Synthetic Example 14

Epoxy Resin Solution Y-1

The epoxy resin (EPPN-502H of NIPPON KAYAKU CO., LTD.) 400 weight parts, a phenol novolak resin (TD-2131 of DAINIPPON INK AND CHEMICALS, Inc.) 400 weight parts and γ-butyrolactone 1000 weight parts were mixed and the resin solution Y-1 was obtained.

Synthetic Example 15

Epoxy Resin Solution Y-2

The epoxy resin (NC-3000 of NIPPON KAYAKU CO., LTD.) 600 weight parts, a phenol novolak resin ("KAYAHARD" TPM of NIPPON KAYAKU CO., LTD. (new name: "KAYAHARD" KTG-105)) 200 weight parts, a curing-accelerator (triphenyl phosphine of HOKKO CHEMICAL INDUSTRY CO., LTD.) 8 weight parts and γ-butyrolactone 1000 weight parts were mixed and a resin solution Y-1 was obtained.

Example 31

The dispersion liquid X-1, 82 weight parts was put into a container equipped with an agitator and thereto the resin solution Y-1, 18 weight parts was added gradually and mixed by the let-down method, and further mixed with a ball mill for 1 hour to obtain a paste composition. At this time, the inorganic filler content was about 61 volume % putting the total quantity of the inorganic filler and the resin as 100 volume %.

The viscosity of the paste composition was measured by a viscometer (Model RE100 of TOKI SANGYO Co., Ltd) with cone plate (R-L 1°34'×R24 of TOKI SANGYO Co., Ltd) at 25° C. and rotation speed 5 rpm. The result is shown in Table 7.

Next, after coating this paste composition on an aluminum substrate and a copper substrate by a spin coater and drying in an oven at 120° C. for 10 minutes, it was cured at 175° C. for 1 hour to obtain dielectric compositions. The stress change depending on the temperature of the dielectric compositions formed on these two kinds of substrate was measured by the stress measuring device Flexus of KLA-Tencor Corporation, and from the change, the coefficient of linear expansion of the dielectric composition was calculated. It was found to be 18 ppm/° C. which is a good value because it is almost the same value as that of copper (17 ppm/° C.).

Next, an aluminum electrode was formed on the surface of the dielectric composition on the aluminum substrate with vapor deposition, and using this and the aluminum substrate as electrodes, the dielectric characteristics at 1 MHz was measured using an impedance analyzer (HP4284A and HP16451B of Hewlett Packard) according to JIS K 6911. The relative dielectric constant was 55, the dielectric loss tangent was 3.3% and the capacitance per area was 4.9 nF/cm$^2$.

Furthermore, as a result of performing the pressure cooker test (PCT test, 100% RH, 121° C., two atmospheric pressures, and 100 hours after) to the dielectric composition on the copper substrate, nothing abnormal was found by microscope observation, and in the cross hatch cut exfoliation scotch tape test method (JIS K5400), evaluation score was as good as ten points.

Here, in each measurement of the coefficient of linear expansion, the dielectric characteristics and PCT test, evaluations were conducted to the three thicknesses of the dielectric composition of 5, 10 and 20 μm. However, since a difference between thicknesses was not seen, it is summarized by the result of 10 μm in Table 9.

Example 32

The dispersion liquid X-1, 86 weight parts was put into a container equipped with an agitator and thereto the resin solution Y-1, 11 weight parts and γ-butyrolactone 3 weight parts were gradually added and mixed by the let-down method, further, it was agitated with a ball mill for 1 hour to obtain a paste composition. At this time, the inorganic filler content was about 72 volume % putting the total quantity of the inorganic filler and the resin as 100 volume %. The viscosity of the paste composition was measured as described in Example 31 and the result is shown in Table 7.

Using the paste composition thus obtained, a dielectric composition was prepared in the same way as example 31 and the results obtained by measuring the coefficient of linear expansion, the dielectric characteristics and the PCT test are shown in Table 9.

Example 33

The dispersion liquid X-1, 88 weight parts was put into a container equipped with an agitator and thereto the resin solution Y-1, 7 weight parts and γ-butyrolactone 5 weight parts were gradually added and mixed by the let-down method, further, it was agitated with a ball mill for 1 hour to obtain a paste composition. At this time, the inorganic filler content was about 79 volume % putting the total quantity of the inorganic filler and the resin as 100 volume %. The viscosity of the paste composition was measured as described in Example 31 and the result is shown in Table 7.

Using the paste composition thus obtained, a dielectric composition was prepared in the same way as example 31 and the results obtained by measuring the coefficient of linear expansion, the dielectric characteristics and the PCT test are shown in Table 9.

Example 34

The dispersion liquid X-1, 89 weight parts was put into a container equipped with an agitator and thereto the resin solution Y-1, 4 weight parts and γ-butyrolactone 7 weight parts were gradually added and mixed by the let-down method, further, it was agitated with a ball mill for 1 hour to obtain a paste composition. At this time, the inorganic filler content was about 86 volume % putting the total quantity of the inorganic filler and the resin as 100 volume %. The viscosity of the paste composition was measured as described in Example 31 and the result is shown in Table 7.

Using the paste composition thus obtained, a dielectric composition was prepared in the same way as example 31 and the results obtained by measuring the coefficient of linear expansion, the dielectric characteristics and the PCT test are shown in Table 9.

Example 35

The dispersion liquid X-1, 90 weight parts was put into a container equipped with an agitator and thereto the resin solution Y-1, 2 weight parts and γ-butyrolactone 8 weight parts were gradually added and mixed by the let-down method, further, it was agitated with a ball mill for 1 hour to obtain a paste composition. At this time, the inorganic filler content was about 91 volume % putting the total quantity of the inorganic filler and the resin as 100 volume %. The viscosity of the paste composition was measured as described in Example 31 and the result is shown in Table 7.

Using the paste composition thus obtained, a dielectric composition was prepared in the same way as example 31 and the results obtained by measuring the coefficient of linear expansion, the dielectric characteristics and the PCT test are shown in Table 9.

Example 36

The dispersion liquid X-1, 91 weight parts was put into a container equipped with an agitator and thereto the resin solution Y-1, 1 weight parts and γ-butyrolactone 8 weight parts were gradually added and mixed by the let-down method, further, it was agitated with a ball mill for 1 hour to obtain a paste composition. At this time, the inorganic filler content was about 93 volume % putting the total quantity of the inorganic filler and the resin as 100 volume %. The viscosity of the paste composition was measured as described in Example 31 and the result is shown in Table 7.

Using the paste composition thus obtained, a dielectric composition was prepared in the same way as example 31 and the results obtained by measuring the coefficient of linear expansion, the dielectric characteristics and the PCT test are shown in Table 9.

Examples 37-43

The dispersion-liquid shown in Table 5, 88 weight part was put in a container equipped with an agitator and thereto the resin solution shown in Table 5, 7 weight parts and γ-butyrolactone 5 weight parts were gradually added and mixed by the let-down method, further, it was agitated with a ball mill for 1 hour to obtain a paste composition. At this time, the inorganic filler content was about 79 volume % putting the total quantity of the inorganic filler and the resin as 100 volume %. The viscosity of the paste compositions was measured as described in Example 31 and the results are shown in Tables 7 and 8.

Using the paste compositions thus obtained, a dielectric composition was prepared in the same way as example 31 and the results obtained by measuring the coefficient of linear expansion, the dielectric characteristics and the PCT test are shown in Table 9 and Table 10.

Example 44

The dispersion liquid X-7, 93 weight parts was put into a container equipped with an agitator and thereto the resin solution Y-1, 7 weight parts were gradually added and mixed by the let-down method, further, it was agitated with a ball mill for 1 hour to obtain a paste composition. At this time, the inorganic filler content was adjusted to about 79 volume % putting the total quantity of the inorganic filler and the resin as 100 volume %. The viscosity of the paste composition was measured as described in Example 31 and the result is shown in Table 8.

Using the paste composition thus obtained, a dielectric composition was prepared in the same way as example 31 and the results obtained by measuring the coefficient of linear expansion, the dielectric characteristics and the PCT test are shown in Table 10.

Example 45

The dispersion liquid X-8, 93 weight parts was put into a container equipped with an agitator and thereto the resin solution Y-1, 7 weight parts were gradually added and mixed by the let-down method, further, it was agitated with a ball mill for 1 hour to obtain a paste composition. At this time, the inorganic filler content was adjusted to about 81 volume % putting the total quantity of the inorganic filler and the resin as 100 volume %. The viscosity of the paste composition was measured as described in Example 31 and the result is shown in Table 8.

Using the paste composition thus obtained, a dielectric composition was prepared in the same way as example 31 and the results obtained by measuring the coefficient of linear expansion, the dielectric characteristics and the PCT test are shown in Table 10.

Example 46

The dispersion liquid X-9, 93 weight parts was put into a container equipped with an agitator and thereto the resin solution Y-1, 7 weight parts were gradually added and mixed by the let-down method, further, it was agitated with a ball mill for 1 hour to obtain a paste composition. At this time, the inorganic filler content was adjusted to about 86 volume % putting the total quantity of the inorganic filler and the resin as 100 volume %. The viscosity of the paste composition was measured as described in Example 31 and the result is shown in Table 8.

Using the paste composition thus obtained, a dielectric composition was prepared in the same way as example 31 and the results obtained by measuring the coefficient of linear expansion, the dielectric characteristics and the PCT test are shown in Table 10.

Comparative Example 4

Using the epoxy resin solution of the Synthetic example 14, except that the inorganic filler dispersion liquid were not used; a dielectric composition was prepared in the same way as example 31. The viscosity of the paste composition was measured as described in Example 31 and the result is shown in Table 8.

The results obtained by measuring the coefficient of linear expansion, the dielectric characteristics and the PCT test are shown in Table 10.

Comparative Example 5

The dispersion liquid X-10, 88 weight parts was put into a container equipped with an agitator and thereto the resin solution Y-1, 7 weight parts and γ-butyrolactone 5 weight parts were gradually added and mixed by the let-down method, further, it was agitated with a ball mill for 1 hour to obtain a paste composition. At this time, the inorganic filler content was about 79 volume % putting the total quantity of the inorganic filler and the resin as 100 volume %. The viscosity of the paste composition was measured as described in Example 31 and the result is shown in Table 8.

Using the paste composition thus obtained, a dielectric composition was prepared in the same way as example 31 and the results obtained by measuring the coefficient of linear expansion, the dielectric characteristics and the PCT test are shown in Table 10.

Comparative Example 6

The dispersion liquid X-11, 88 weight parts was put into a container equipped with an agitator and thereto the resin solution Y-1, 7 weight parts and γ-butyrolactone 5 weight parts were gradually added and mixed by the let-down method, further, it was agitated with a ball mill for 1 hour to obtain a paste composition. The filler of this paste composition was apt to sediment when left alone. At this time, the inorganic filler content was about 79 volume % putting the total quantity of the inorganic filler and the resin as 100 volume %. The viscosity of the paste composition was measured as described in Example 31 and the result is shown in Table 8.

Using the paste composition thus obtained, a dielectric composition was prepared in the same way as example 31 and a measurement of dielectric characteristics was tried. However, measured values were inconsistent and a reliable measurement was impossible.

Comparative Example 7

The dispersion liquid X-12, 88 weight parts was put into a container equipped with an agitator and thereto the resin solution Y-1, 7 weight parts and γ-butyrolactone 5 weight parts were gradually added and mixed by the let-down method, further, it was agitated with a ball mill for 1 hour to obtain a paste composition. The filler of this paste composition was apt to sediment when left alone. At this time, the inorganic filler content was about 79 volume % putting the total quantity of the inorganic filler and the resin as 100 volume %. The viscosity of the paste composition was measured as described in Example 31 and the result is shown in Table 8.

Using the paste composition thus obtained, a dielectric composition was prepared in the same way as example 31 and a measurement of dielectric characteristics was tried. However, measured values were inconsistent and a reliable measurement was not possible.

Comparative Example 8

The dispersion liquid X-13, 8893 weight parts was put into a container equipped with an agitator and thereto a resin solution Y-1, 7 weight parts and γ-butyrolactone 5 weight parts were gradually added and mixed by the let-down method, further, it was agitated with a ball mill for 1 hour to obtain a paste composition. The filler of this paste composition was apt to sediment when left alone. At this time, the inorganic filler content was about 79 volume % putting the total quantity of the inorganic filler and the resin as 100 volume %. The viscosity of the paste composition was measured as described in Example 31 and the result is shown in Table 8.

Using the paste composition thus obtained, a dielectric composition was prepared in the same way as example 31 and measurement of dielectric characteristics was tried. However, measured values were inconsistent and a reliable measurement was not possible.

Comparative Example 9

Except changing the barium titanate filler with a large particle diameter (BT-05 of SAKAI CHEMICAL INDUSTRY Co., Ltd., mean particle diameter: 0.5 μm) to a barium titanate filler (HPB-1000 of TPL Inc., mean particle diameter: 0.059 μm) and changing the barium titanate filler with a small particle diameter (HPB-1000 of TPL Inc., mean particle diameter: 0.059 μm) to a strontium titanate filler (HPS-2000 of TPL. Inc., mean particle diameter: 0.045 μm), it was tried to obtain a dispersion liquid in the same way as that of Synthetic example 3. However, the filler cohered and the dispersion liquid was unstable, and it was impossible to obtain a paste composition.

Comparative Example 10

A silica filler (mean particle diameter: 0.5 μm) 5328 weight parts, a b silica filler (mean particle diameter: 0.06 μm) 1872 weight parts, γ-butyrolactone 928 weight parts and a dispersant (BYK-W9010 of BYK-Chemie Japan KK: a copolymer having an acid group with a phosphoric-ester skeleton) 72 weight parts were mixed under ice-cooling for 1 hour using a homogenizer. Cohesion was hard and fluidic material couldn't be obtained.

Comparative Example 11

A silica filler (mean particle diameter: 0.5 μm) 2456 weight parts, a b silica filler (mean particle diameter: 0.06 μm) 863 weight parts, γ-butyrolactone 928 weight parts and a dispersant (BYK-W9010 of BYK-Chemie Japan KK: a copolymer having an acid group with a phosphoric-ester skeleton) 72 weight parts were mixed and dispersed under ice-cooling for 1 hour using a homogenizer, and a fluidic dispersion X-15 was obtained.

88 weight parts of the fluidic dispersion X-15 was put in a container equipped with an agitator and thereto 7 weight parts of the resin solution Y-1 and γ-butyrolactone 5 weight parts were gradually added and mixed by the let-down method, further, it was agitated with a ball mill for 1 hour. At this time, the inorganic filler content was about 79 volume % putting the total quantity of the inorganic filler and the resin as 100 volume %. However, the filler cohered and the dispersion liquid was unstable, and it was impossible to obtain a paste composition.

FIELD OF INDUSTRIAL APPLICATION

The paste composition and the dielectric composition of this invention are preferably used in the field of a capacitor, an interlayer insulation material for a circuit material which functions as a capacitor and an optical wiring material.

TABLE 1

| Example | Paste composition | | | | | Content of the inorganic filler in the solid content (wt %) | content of the solvent in the paste (wt %) |
| --- | --- | --- | --- | --- | --- | --- | --- |
| | Inorganic filler | Resin | Curing agent | Solvent | Additive agent | | |
| 1 | Barium Titanate SAKAI CHEMICAL BT-05 | Epoxy resin NIPPON KAYAKU EPPN502H | Phenol Novolak resin DAINIPPON INK TD2131 | γ-butyrolactone | triphenylphosphine | 94 | 10 |
| 2 | Barium Titanate SAKAI CHEMICAL BT-05 | Epoxy resin NIPPON KAYAKU EPPN502H | Phenol Novolak resin DAINIPPON INK TD2131 | γ-butyrolactone | triphenylphosphine | 94 | 15 |
| 3 | Barium Titanate SAKAI CHEMICAL BT-05 | Epoxy resin NIPPON KAYAKU EPPN502H | Phenol Novolak resin DAINIPPON INK TD2131 | γ-butyrolactone | triphenylphosphine | 94 | 20 |
| 4 | Barium Titanate SAKAI CHEMICAL BT-05 | Epoxy resin NIPPON KAYAKU EPPN502H | Phenol Novolak resin DAINIPPON INK TD2131 | γ-butyrolactone | triphenylphosphine | 94 | 25 |
| 5 | Barium Titanate SAKAI CHEMICAL BT-05 | Epoxy resin NIPPON KAYAKU EPPN502H | Phenol Novolak resin DAINIPPON INK TD2131 | γ-butyrolactone | triphenylphosphine BYK-W903 | 94 | 10 |
| 6 | Barium Titanate SAKAI CHEMICAL BT-05 | Epoxy resin NIPPON KAYAKU EPPN502H | Phenol Novolak resin DAINIPPON INK TD2131 | γ-butyrolactone | triphenylphosphine BYK-W903 | 94 | 15 |
| 7 | Barium Titanate SAKAI CHEMICAL BT-05 | Epoxy resin NIPPON KAYAKU EPPN502H | Phenol Novolak resin DAINIPPON INK TD2131 | N-methyl-2-pyrrolidone | triphenylphosphine | 94 | 15 |
| 8 | Barium Titanate SAKAI CHEMICAL BT-05 | Epoxy resin NIPPON KAYAKU EPPN502H | Phenol Novolak resin DAINIPPON INK TD2131 | Ethylene glycol diacetate | triphenylphosphine | 94 | 15 |

| Example | Thickness (μm) | Dielectric Characteristics (1 MHz) | | | Film Characteristic Porosity (volume %) |
| --- | --- | --- | --- | --- | --- |
| | | Relative dielectric constant | Capacitance (nF/cm$^2$) | Dielectric loss tangent (%) | |
| 1 | 10 | 82 | 7.3 | 2.8 | 9 |
| 2 | 15 | 73 | 4.3 | 3.4 | 12 |
| 3 | 10 | 65 | 5.8 | 3.0 | 14 |
| 4 | 8 | 58 | 6.4 | 3.2 | 20 |
| 5 | 8 | 102 | 11.3 | 3.6 | 6 |
| 6 | 10 | 95 | 8.4 | 3.1 | 7 |
| 7 | 10 | 58 | 5.3 | 4.6 | 26 |
| 8 | 10 | 64 | 5.7 | 4.8 | 21 |

TABLE 2

| Example | Paste composition | | | | | Content of the inorganic filler in the solid content (wt %) | content of the solvent in the paste (wt %) |
| --- | --- | --- | --- | --- | --- | --- | --- |
| | Inorganic filler | Resin | Curing agent | Solvent | Additive agent | | |
| 9 | Barium Titanate SAKAI CHEMICAL BT-05 | Epoxy resin NIPPON KAYAKU EPPN502H | Phenol Novolak resin DAINIPPON INK TD2131 | Ethyl carbitol | triphenylphosphine | 94 | 15 |
| 10 | Barium Titanate SAKAI CHEMICAL BT-05 | Epoxy resin NIPPON KAYAKU EPPN502H | Phenol Novolak resin DAINIPPON INK TD2131 | γ-butyrolactone | triphenylphosphine | 96 | 15 |
| 11 | Barium Titanate SAKAI CHEMICAL BT-05 | Epoxy resin NIPPON KAYAKU EPPN502H | Phenol Novolak resin DAINIPPON INK TD2131 | γ-butyrolactone | triphenylphosphine | 90 | 15 |

TABLE 2-continued

| | Inorganic filler | Resin | Curing agent | Solvent | Additive agent | Content of the inorganic filler in the solid content (wt %) | content of the solvent in the paste (wt %) |
|---|---|---|---|---|---|---|---|
| 12 | Barium Titanate Toho Titaniumum SB05 | Epoxy resin NIPPON KAYAKU EPPN502H | Phenol Novolak resin DAINIPPON INK TD2131 | γ-butyrolactone | triphenylphosphine | 94 | 15 |
| 13 | Strontium Titanate SAKAI CHEMICAL ST-03 | Epoxy resin NIPPON KAYAKU EPPN502H | Phenol Novolak resin DAINIPPON INK TD2131 | γ-butyrolactone | triphenylphosphine | 94 | 15 |
| 14 | Barium Titanate SAKAI CHEMICAL BT-05 | Epoxy resin NIPPON KAYAKU NC3000 | Phenol Novolak resin DAINIPPON INK TD2131 | γ-butyrolactone | triphenylphosphine | 94 | 15 |
| 15 | Barium Titanate SAKAI CHEMICAL BT-05 | Epoxy resin NIPPON KAYAKU NC3000 | Phenol Novolak resin NIPPON KAYAKU KAYAHARD TPM | γ-butyrolactone | triphenylphosphine | 94 | 15 |
| 16 | Barium Titanate SAKAI CHEMICAL BT-05 | Epoxy resin DAINIPPON INK HP7200 | Phenol Novolak resin DAINIPPON INK VH4150 | γ-butyrolactone | triphenylphosphine | 94 | 15 |

| | | Dielectric Characteristics (1 MHz) | | | Film Characteristic |
|---|---|---|---|---|---|
| Example | Thickness (μm) | Relative dielectric constant | Capacitance (nF/cm$^2$) | Dielectric loss tangent (%) | Porosity (volume %) |
| 9 | 10 | 50 | 4.4 | 2.2 | 30 |
| 10 | 12 | 79 | 5.8 | 3.4 | 13 |
| 11 | 8 | 76 | 8.4 | 3.2 | 5 |
| 12 | 10 | 70 | 6.2 | 2.9 | 14 |
| 13 | 15 | 65 | 3.8 | 1.2 | 14 |
| 14 | 15 | 71 | 4.2 | 2.7 | 16 |
| 15 | 12 | 76 | 5.6 | 2.8 | 14 |
| 16 | 10 | 69 | 6.1 | 3.0 | 16 |

TABLE 3

| | Paste composition | | | | | | |
|---|---|---|---|---|---|---|---|
| Example | Inorganic filler | Resin | Curing agent | Solvent | Additive agent | Content of the inorganic filler in the solid content (wt %) | content of the solvent in the paste (wt %) |
| 17 | Barium Titanate SAKAI CHEMICAL BT-05 | Polyiimide resin TORAY Semicofine SP341 | — | γ-butyrolactone | — | 94 | 15 |
| 18 | Barium Titanate SAKAI CHEMICAL BT-05 | Polyethersulfone Sumitomo Chemical 5003P | — | γ-butyrolactone | — | 94 | 15 |
| 19 | Barium Titanate SAKAI CHEMICAL BT-05 | Epoxy resin NIPPON KAYAKU EPPN502H | Phenol Novolak resin DAINIPPON INK TD2131 | γ-butyrolactone | triphenylphosphine | 94 | 15 |
| 20 | Barium Titanate SAKAI CHEMICAL BT-05 | Epoxy resin NIPPON KAYAKU EPPN502H | Phenol Novolak resin DAINIPPON INK TD2131 | γ-butyrolactone | triphenylphosphine BYK-W9010 | 94 | 15 |
| 21 | Barium Titanate SAKAI CHEMICAL BT-05 | Epoxy resin NIPPON KAYAKU NC3000 | Phenol Novolak resin NIPPON KAYAKU KAYAHARD TPM | γ-butyrolactone | triphenylphosphine | 94 | 15 |

| | | Dielectric Characteristics (1 MHz) | | | Film Characteristic |
|---|---|---|---|---|---|
| Example | Thickness (μm) | Relative dielectric constant | Capacitance (nF/cm$^2$) | Dielectric loss tangent (%) | Porosity (volume %) |
| 17 | 10 | 68 | 6.0 | 0.7 | 17 |
| 18 | 8 | 65 | 7.2 | 0.5 | 17 |
| 19 | 15 | 73 | 4.3 | 3.4 | 12 |

TABLE 3-continued

| | | | | | |
|---|---|---|---|---|---|
| 20 | 10 | 95 | 8.4 | 3.1 | 7 |
| 21 | 12 | 76 | 5.6 | 2.8 | 14 |

TABLE 4

| Comparative example | Paste composition | | | | | Content of the inorganic filler in the solid content(wt %) | content of the solvent in the paste (wt %) |
|---|---|---|---|---|---|---|---|
| | Inorganic filler | Resin | Curing agent | Solvent | Additive agent | | |
| 1 | Barium Titanate SAKAI CHEMICAL BT-05 | Epoxy resin NIPPON KAYAKU EPPN502H | Phenol Novolak resin DAINIPPON INK TD2131 | γ-butyrolactone | triphenylphosphine | 94 | 40 |
| 2 | Barium Titanate SAKAI CHEMICAL BT-05 | Epoxy resin NIPPON KAYAKU EPPN502H | Phenol Novolak resin DAINIPPON INK TD2131 | Morpholine | triphenylphosphine | 94 | 15 |
| 3 | Barium Titanate SAKAI CHEMICAL BT-05 | Epoxy resin NIPPON KAYAKU EPPN502H | Phenol Novolak resin DAINIPPON INK TD2131 | Propylene glycol mono-methylether acetate | triphenylphosphine | 94 | 15 |

| Comparative example | Thickness (μm) | Dielectric Characteristics (1 MHz) | | | Film Characteristic Porosity (volume %) |
|---|---|---|---|---|---|
| | | Relative dielectric constant | Capacitance (nF/cm$^2$) | Dielectric loss tangent (%) | |
| 1 | 15 | 41 | 2.4 | 4.9 | 31 |
| 2 | 12 | 35 | 2.6 | 5.8 | 32 |
| 3 | 15 | 46 | 2.7 | 4.7 | 35 |

TABLE 5

| | Paste composition | | | |
|---|---|---|---|---|
| | Inorganic filler | | Resin | Curing agent |
| | A | B | | |
| Example 22 | Barium Titanate SAKAI CHEMICAL BT-05 | Barium Titanate TPL.Inc HPB-1000 | Epoxy resin NIPPON KAYAKU EPPN502H | Phenol Novolak resin DAINIPPON INK TD2131 |
| Example 23 | Barium Titanate SAKAI CHEMICAL BT-05 | Barium Titanate TPL.Inc HPB-1000 | Epoxy resin NIPPON KAYAKU NC3000 | Phenol Novolak resin NIPPON KAYAKU KAYAHARD TPM |
| Example 24 | Barium Titanate SAKAI CHEMICAL BT-05 | Barium Titanate TPL.Inc HPB-1000 | Epoxy resin NIPPON KAYAKU NC3000 | Phenol Novolak resin NIPPON KAYAKU KAYAHARD TPM |
| Example 25 | Barium Titanate SAKAI CHEMICAL BT-05 | Barium Titanate TPL.Inc HPB-1000 | Epoxy resin NIPPON KAYAKU NC3000 | Phenol Novolak resin NIPPON KAYAKU KAYAHARD TPM |
| Example 26 | Barium Titanate SAKAI CHEMICAL BT-05 | Barium Titanate TPL.Inc HPB-1000 | Epoxy resin NIPPON KAYAKU NC3000 | Phenol Novolak resin NIPPON KAYAKU KAYAHARD TPM |
| Example 27 | Barium Titanate SAKAI CHEMICAL BT-05 | Barium Titanate TPL.Inc HPB-1000 | Epoxy resin NIPPON KAYAKU NC3000 | Phenol Novolak resin NIPPON KAYAKU KAYAHARD TPM |
| Example 28 | Barium Titanate SAKAI CHEMICAL BT-05 | Barium Titanate TPL.Inc HPB-1000 | Epoxy resin NIPPON KAYAKU NC3000 | Phenol Novolak resin NIPPON KAYAKU KAYAHARD TPM |
| Example 29 | Barium Titanate SAKAI CHEMICAL BT-05 | Barium Titanate TPL.Inc HPB-1000 | Epoxy resin NIPPON KAYAKU NC3000 | Phenol Novolak resin NIPPON KAYAKU KAYAHARD TPM |
| Example 30 | Barium Titanate SAKAI CHEMICAL BT-05 | Barium Titanate TPL.Inc HPB-1000 | Epoxy resin NIPPON KAYAKU NC3000 | Phenol Novolak resin NIPPON KAYAKU KAYAHARD TPM |

TABLE 5-continued

| | Paste composition | | | |
|---|---|---|---|---|
| | Solvent | Additive | Content of the inorganic filler in the solid content (wt %) | Content of the solvent in the paste (wt %) |
| Example 22 | γ-butyrolactone | triphenylphosphine BYK-W9010 | 96 | 20 |
| Example 23 | γ-butyrolactone | triphenylphosphine BYK-W9010 | 96 | 20 |
| Example 24 | Ethylene glycol diacetate | triphenylphosphine BYK-W9010 | 96 | 20 |
| Example 25 | Diethyl malonate | triphenylphosphine BYK-W9010 | 96 | 20 |
| Example 26 | Ethyl carbitol | triphenylphosphine BYK-W9010 | 96 | 20 |
| Example 27 | 4-methylcyclohexanone | triphenylphosphine BYK-W9010 | 96 | 20 |
| Example 28 | Isophorone | triphenylphosphine BYK-W9010 | 96 | 20 |
| Example 29 | Diethylformamide | triphenylphosphine BYK-W9010 | 96 | 20 |
| Example 30 | Dimethylacetamide | triphenylphosphine BYK-W9010 | 96 | 20 |

TABLE 6

| | Dielectric Characteristics (1 MHz) | | | | Film Characteristic |
|---|---|---|---|---|---|
| | Thickness (μm) | Relative dielectric constant | Capacitance (nF/cm$^2$) | Dielectric loss tangent (%) | Porosity (volume %) |
| Example 22 | 10 | 123 | 10.9 | 3.1 | 4 |
| Example 23 | 10 | 121 | 10.7 | 2.6 | 4 |
| Example 24 | 10 | 95 | 8.4 | 3.1 | 8 |
| Example 25 | 10 | 85 | 7.5 | 2.7 | 9 |
| Example 26 | 10 | 99 | 8.8 | 2.9 | 7 |
| Example 27 | 10 | 79 | 7.0 | 2.1 | 12 |
| Example 28 | 10 | 76 | 6.7 | 2.2 | 11 |
| Example 29 | 10 | 70 | 6.2 | 2.3 | 15 |
| Example 30 | 10 | 79 | 7.0 | 2.3 | 11 |

TABLE 7

| | Paste composition | | | | | | | | |
|---|---|---|---|---|---|---|---|---|---|
| | | Inorganic filler | | | | | Inorganic | | |
| | Dispersion liquid | Inorganic filler composition | Mean particle diameter (μm) | Inorganic filler composition | Mean particle diameter (μm) | Max/Min (ratio) | Resin solution Epoxy resin | filler/resin ratio Volume ratio | Stability of dispersion liquid | Viscosity (mP·S) |
| Example 31 | X-1 | Barium Titanate | 0.5 | Barium Titanate | 0.059 | 8.5 | Y-1 | 61/39 | Stability | 81 |
| Example 32 | X-1 | Barium Titanate | 0.5 | Barium Titanate | 0.059 | 8.5 | Y-1 | 72/28 | Stability | 51 |
| Example 33 | X-1 | Barium Titanate | 0.5 | Barium Titanate | 0.059 | 8.5 | Y-1 | 79/21 | Stability | 43 |
| Example 34 | X-1 | Barium Titanate | 0.5 | Barium Titanate | 0.059 | 8.5 | Y-1 | 86/14 | Stability | 46 |
| Example 35 | X-1 | Barium Titanate | 0.5 | Barium Titanate | 0.059 | 8.5 | Y-1 | 91/9 | Stability | 45 |
| Example 36 | X-1 | Barium Titanate | 0.5 | Barium Titanate | 0.059 | 8.5 | Y-1 | 93/7 | Stability | 52 |
| Example 37 | X-1 | Barium Titanate | 0.5 | Barium Titanate | 0.059 | 8.5 | Y-2 | 79/21 | Stability | 50 |
| Example 38 | X-2 | Barium Titanate | 0.5 | Barium Titanate | 0.060 | 8.3 | Y-2 | 79/21 | Stability | 106 |
| Example 39 | X-3 | Barium Titanate | 0.18 | Barium Titanate | 0.059 | 3.1 | Y-1 | 79/21 | Stability | 72 |
| Example 40 | X-4 | Barium Titanate | 0.28 | Barium Titanate | 0.059 | 4.7 | Y-1 | 79/21 | Stability | 44 |
| Example 41 | X-5 | Barium Titanate | 1.2 | Barium Titanate | 0.059 | 20.3 | Y-1 | 79/21 | Instability (filler sedimentation) | 36 |
| Example 42 | X-6 | Barium Titanate | 2.1 | Barium Titanate | 0.059 | 35.6 | Y-1 | 79/21 | Instability (filler sedimentation) | 36 |

TABLE 8

| | | Paste composition | | | | | | | | |
|---|---|---|---|---|---|---|---|---|---|---|
| | | Inorganic filler | | | | | Inorganic | | | |
| | Dispersion liquid | Inorganic filler composition | Mean particle diameter (μm) | Inorganic filler composition | Mean particle diameter (μm) | Max/ Min (ratio) | Resin solution Epoxy resin | filler/resin ratio Volume ratio | Stability of dispersion liquid | Viscosity (mP·S) |
| Example 43 | X-2 | Barium Titanate | 0.5 | Barium Titanate | 0.060 | 8.3 | Y-1 | 79/21 | Stability | 50 |
| Example 44 | X-7 | Barium Titanate | 0.5 | Strontium Titanate | 0.045 | 11.1 | Y-1 | 79/21 | Stability | 60 |
| Example 45 | X-8 | Barium Titanate | 0.5 | Titanium Oxide | 0.2 | 2.5 | Y-1 | 81/19 | Instability slightly (cohesion) | 79 |
| Example 46 | X-9 | Lead type filler | 0.9 | Barium Titanate | 0.059 | 15.3 | Y-1 | 86/14 | Stability | 58 |
| Comparative example 4 | — | | | | | | Y-1 | 0/100 | — | 60 |
| Comparative example 5 | X-10 | Barium Titanate | 0.5 | — | — | — | Y-1 | 79/21 | Stability | 38 |
| Comparative example 6 | X-11 | Barium Titanate | 7 | Barium Titanate | 0.5 | 14 | Y-1 | 79/21 | Instability (filler sedimentation) | 22 |
| Comparative example 7 | X-12 | Barium Titanate | 40 | Barium Titanate | 2.1 | 19 | Y-1 | 79/21 | Instability (filler sedimentation) | 13 |
| Comparative example 8 | X-13 | Barium Titanate | 20 | Barium Titanate | 2.1 | 9.5 | Y-1 | 79/21 | Instability (filler sedimentation) | 12 |
| Comparative example 9 | — | Barium Titanate | 0.059 | Strontium Titanate | 0.045 | 1.3 | Y-1 | 79/21 | Instability (cohesion) | — |
| Comparative example 11 | — | Silica | 0.5 | Silica | 0.06 | 8.3 | Y-1 | 79/12 | Instability (cohesion) | — |

TABLE 9

| | High dielectric constant composition | | | | | |
|---|---|---|---|---|---|---|
| | | | Dielectric Characteristics @1 MHz | | | |
| | Thickness (μm) | Coefficient of linear expansion (ppm/°C.) | Relative dielectric constant | Dielectric loss tangent (%) | Capacitance (nF/cm$^2$) | After PCT test, evaluation score in the cross hatch cut exfoliation scotch tape test |
| Example 31 | 10 | 18 | 55 | 3.3 | 4.9 | 10 |
| Example 32 | 10 | 17 | 98 | 4.4 | 8.7 | 10 |
| Example 33 | 10 | 16 | 110 | 4.4 | 9.7 | 10 |
| Example 34 | 10 | 16 | 109 | 4.6 | 9.7 | 10 |
| Example 35 | 10 | 16 | 98 | 6.2 | 8.7 | 8 |
| Example 36 | 10 | 16 | 75 | 8.3 | 6.6 | 4 |
| Example 37 | 10 | 16 | 106 | 2.9 | 9.4 | 10 |
| Example 38 | 10 | 16 | 114 | 2.2 | 10.1 | 10 |
| Example 39 | 10 | 16 | 93 | 2.8 | 8.2 | 10 |
| Example 40 | 10 | 16 | 102 | 2.8 | 9.0 | 10 |
| Example 41 | 10 | 16 | 135 | 3.7 | 12.0 | 10 |
| Example 42 | 10 | 16 | 150 | 4.1 | 13.3 | 10 |

TABLE 10

| | High dielectric constant composition | | | | | |
|---|---|---|---|---|---|---|
| | | | Dielectric Characteristics @1 MHz | | | |
| | Thickness (μm) | Coefficient of linear expansion (ppm/°C.) | Relative dielectric constant | Dielectric loss tangent (%) | Capacitance (nF/cm$^2$) | After PCT test, evaluation score in the cross hatch cut exfoliation scotch tape test |
| Example 43 | 10 | 16 | 115 | 2.9 | 10.2 | 10 |
| Example 44 | 10 | 16 | 91 | 3.9 | 8.1 | 10 |
| Example 45 | 10 | 15 | 47 | 2.6 | 4.2 | 10 |
| Example 46 | 10 | 15 | 80 | 3.5 | 7.1 | 10 |
| Comparative example 4 | 10 | 53 | 4 | 2.8 | 0.3 | 10 |
| Comparative example 5 | 10 | 25 | 72 | 6.8 | 6.4 | 8 |

TABLE 10-continued

| | | High dielectric constant composition | | | | |
| | | | Dielectric Characteristics @1 MHz | | | |
| | Thickness (μm) | Coefficient of linear expansion (ppm/° C.) | Relative dielectric constant | Dielectric loss tangent (%) | Capacitance (nF/cm²) | After PCT test, evaluation score in the cross hatch cut exfoliation scotch tape test |
|---|---|---|---|---|---|---|
| Comparative example 6 | 10 | 32 | Measured values inconsistent and a reliable measurement was impossible | | | 6 |
| Comparative example 7 | 10 | 36 | Measured values inconsistent and a reliable measurement was impossible | | | 6 |
| Comparative example 8 | 10 | 35 | Measured values inconsistent and a reliable measurement was impossible | | | 6 |
| Comparative example 9 | | | The filler cohered and it was impossible to obtain a paste | | | |
| Comparative example 11 | | | The filler cohered and it was impossible to obtain a paste | | | |

The invention claimed is:

1. A paste composition containing an inorganic filler, a resin, a compound having a phosphoric ester skeleton and a solvent, wherein the paste composition is characterized in that it contains one or more solvents of which the boiling point is 160° C. or higher and an inorganic filler of which the mean particle diameter is 5 μm or smaller, the inorganic filler is at least one selected from the group consisting of a barium titanate, a barium zirconate titanate, a strontium titanate, a calcium titanate, a bismuth titanate, a magnesium titanate, a barium neodymium titanate, a barium tin titanate, a barium magnesium niobate, a barium magnesium tantalate, a lead titanate, a lead zirconate, a lead zirconate titanate, a lead niobate, a lead magnesium niobate, a lead nickel niobate, a lead tungstate, a calcium tungstate, a lead magnesium tungstate, and a titanium dioxide, the content of the inorganic filler is 85 wt % or more and 99 wt % or less based on the total amount of the solid component contained in the paste composition, and the total content of the solvent being 25 wt % or less based on the total amount of the paste composition, and the resin being a thermosetting resin selected from the group consisting of a polyimide resin and an epoxy resin, and when the thermosetting resin is an epoxy resin, the paste composition further contains a curing accelerator or a curing accelerator and a curing agent.

2. A paste composition according to claim 1, wherein the inorganic filler contains inorganic fillers of at least two kinds of mean particle diameter, and the greatest mean particle diameter of said mean particle diameters is 0.1-5 μm and is 3 times or more to the minimum mean particle diameter.

3. A paste composition according to claim 1, which contains at least one kind of solvent having an ester structure.

4. A paste composition according to claim 1, which contains at least one kind of solvent having a lactone structure.

5. A dielectric composition obtainable by drying and heat-curing the paste composition described in claim 1, wherein the content of the inorganic filler is 85 to 99 wt % based on the total amount of the solid component contained in the dielectric composition, and a porosity is less than 30 volume %.

6. A high dielectric constant composition according to claim 5, wherein the high dielectric composition has a film configuration having a film thickness of 0.5 μm or thicker and 20 μm or thinner.

7. A capacitor using the paste composition of claim 1.

8. An optical wiring using the paste composition of claim 1.

* * * * *